United States Patent
Kato et al.

(10) Patent No.: US 10,138,162 B2
(45) Date of Patent: Nov. 27, 2018

(54) METHOD AND DEVICE FOR BONDING WORKPIECES EACH PRODUCED FROM GLASS SUBSTRATE OR QUARTZ SUBSTRATE

(71) Applicant: USHIO DENKI KABUSHIKI KAISHA, Tokyo (JP)

(72) Inventors: Akira Kato, Tokyo (JP); Kinichi Morita, Tokyo (JP); Shinji Suzuki, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/380,746

(22) PCT Filed: Feb. 15, 2013

(86) PCT No.: PCT/JP2013/053627
§ 371 (c)(1),
(2) Date: Aug. 25, 2014

(87) PCT Pub. No.: WO2013/129129
PCT Pub. Date: Sep. 6, 2013

(65) Prior Publication Data
US 2015/0013388 A1     Jan. 15, 2015

(30) Foreign Application Priority Data
Feb. 27, 2012    (JP) ................. 2012-039754

(51) Int. Cl.
     *C03C 27/06*        (2006.01)
     *C03B 20/00*        (2006.01)
     (Continued)

(52) U.S. Cl.
     CPC .............. *C03C 27/06* (2013.01); *C03B 20/00* (2013.01); *C03B 23/203* (2013.01);
     (Continued)

(58) Field of Classification Search
CPC ... C03C 23/002; C03C 23/0075; C03C 27/06; C03C 27/00; C03B 20/00; C03B 33/06;
(Continued)

(56) References Cited

U.S. PATENT DOCUMENTS 6,951,119 B1 * 10/2005 Quenzer ............. B81C 1/00047
                                                      65/102
2003/0234029 A1 * 12/2003 Bergman ................ B08B 3/045
                                                         134/1
(Continued)

FOREIGN PATENT DOCUMENTS

JP        04303448 A    * 10/1992
JP        H06-021741 A     1/1994
(Continued)

OTHER PUBLICATIONS

JP 07154177 machine translation, Manufacture of Piezoelectric Device. (Year: 1995).*

(Continued)

*Primary Examiner* — Queenie S Dehghan
(74) *Attorney, Agent, or Firm* — Studebaker & Brackett PC

(57) ABSTRACT

Vacuum ultraviolet light with a wavelength of 200 nm or less is applied on the joining surfaces of first and second workpieces made from a crystal substrate and a glass substrate, or a glass substrate and a glass substrate from a light irradiation unit. The workpieces are conveyed to a workpiece cleaning and laminating mechanism by a conveyance mechanism, the joining surfaces are subjected to mega-sonic cleaning as needed, and the workpieces are aligned with the joining surfaces thereof facing each other, and laminated such that the joining surfaces are in contact with each other. After being laminated, the laminated workpieces are conveyed to a workpiece heating mechanism and heated to increase the workpiece temperature to a predetermined temperature, and (Continued)

this temperature is maintained until joining is completed. The laminated workpieces are brought into a thermally expanded state upon heating, and are joined in this state.

16 Claims, 9 Drawing Sheets

(51) Int. Cl.
  *C03C 23/00*    (2006.01)
  *C30B 29/18*    (2006.01)
  *C30B 33/06*    (2006.01)
  *C03C 27/00*    (2006.01)
  *C03B 23/203*    (2006.01)

(52) U.S. Cl.
  CPC ........ *C03C 23/002* (2013.01); *C03C 23/0075* (2013.01); *C03C 27/00* (2013.01); *C30B 29/18* (2013.01); *C30B 33/06* (2013.01); *Y02P 40/57* (2015.11)

(58) Field of Classification Search
  CPC . C03B 23/203; C03B 23/002; C03B 23/0075; C30B 29/18
  USPC .................................................. 65/30.1, 355
  See application file for complete search history.

(56) References Cited

U.S. PATENT DOCUMENTS

| | | | | |
|---|---|---|---|---|
| 2008/0210380 A1* | 9/2008 | Mizuno | ................... | C03C 27/02 156/379.7 |
| 2008/0283515 A1* | 11/2008 | Ookura | ............. | H01L 21/67178 219/446.1 |
| 2009/0002579 A1* | 1/2009 | Tan | ..................... | G02F 1/13363 349/9 |
| 2010/0273333 A1* | 10/2010 | Kato | ................... | F27B 17/0025 438/795 |
| 2012/0088350 A1* | 4/2012 | Kerdiles | ............... | H01L 21/187 438/455 |
| 2012/0202010 A1* | 8/2012 | Uchida | ................... | B32B 17/06 428/157 |
| 2014/0318578 A1* | 10/2014 | Enicks | ................ | C03C 23/0075 134/15 |
| 2015/0370160 A1* | 12/2015 | Yamada | ................... | G03F 1/24 430/5 |

FOREIGN PATENT DOCUMENTS

| | | | | |
|---|---|---|---|---|
| JP | H07-154177 | A | | 6/1995 |
| JP | H09-221342 | A | | 8/1997 |
| JP | 11246241 | A | * | 9/1999 |
| JP | 2001118818 | A | * | 4/2001 ............... A61L 2/10 |
| JP | 2003-029035 | A | | 1/2003 |
| JP | 2007-041117 | A | | 2/2007 |
| JP | 2007-297249 | A | | 11/2007 |
| JP | 2009-280420 | A | | 12/2009 |
| JP | 2010-046696 | A | | 3/2010 |
| JP | 2010-243966 | A | | 10/2010 |

OTHER PUBLICATIONS

JP 04-303448, Araki et al., Ultraviolet Ray Irradiating Device, Oct. 27, 1992. (Year: 1992).*
International Search Report; PCT/JP2013/053627; dated May 7, 2013.

* cited by examiner

METHOD AND DEVICE FOR BONDING WORKPIECES EACH PRODUCED FROM GLASS SUBSTRATE OR QUARTZ SUBSTRATE

TECHNICAL FIELD

The present invention relates to a method and a device for boding workpieces, made from a crystal substrate such as quartz (quartz crystal) and another crystal substrate, from a crystal substrate and a glass substrate, or from a glass substrate and another glass substrate.

BACKGROUND ART

A joining technique for laminating and bonding a plurality of workpieces is employed in a variety of fields. In an optical field, for example, such joining (joint or bonding) technique is used to fabricate a multilayer (layered, laminated or laminate) optical member, which includes a plurality of laminated workpieces.

Workpieces to be laminated may be glass substrates and/or crystal (crystalline) substrates (e.g., quartz substrates). A pair of a glass substrate and a glass substrate, a pair of a glass substrate and a crystal substrate, or a pair of a crystal substrate and a crystal substrate may be used to provide a multilayer optical member depending upon an intended use. Each substrate may be planar, or have a concave surface or a convex surface.

One example of the optical member is a wavelength (wave) plate or board. The wavelength plate is an optical element that generates a phase difference in the light passing the wavelength plate. The wavelength plate is made from a plurality of birefringent crystal substrates (e.g., quartz substrates) bonded to each other.

An optical low-pass filter may be attached to a front face of an image pick-up (or imaging) device, such as CCD and CMOS, to prevent moire and false colors. The optical low-pass filter may be made from a quartz substrate and a glass substrate bonded to each other, or two quartz substrates bonded to each other.

When an optical lens is fabricated, a plurality of glass lenses having different refractive indexes are bonded to each other to suppress aberrations and obtain necessary optical features.

The joining technique for joining the workpieces such as glass substrates and crystal substrates may be used in fields other than the optical field. For example, a process of fabricating a micromachine such as a piezoresistance semiconductor pressure sensor, an acceleration sensor and an actuator may include a process of joining silicon substrates, which are crystal substrates, to each other. When various quartz devices are manufactured, quartz substrates may be bonded to each other. In the field of electronic devices, a single crystal wafer bonding process may include a similar joining technique.

When the workpieces such as glass substrates and/or crystal substrates are bonded, the following joining techniques are used.

Conventionally, as shown in Patent Literature 1, for example, a bonding (adhesive) agent is applied on joining surfaces of workpieces, and the workpieces are laminated. An ultraviolet curing adhesive is often used as the bonding agent, as disclosed in Patent Literature 2.

Methods of boding glass substrates to each other include, other than the above-described method, a method of providing a low melting point glass frit between the joining surfaces and bonding the substrates by fusion as disclosed in Patent Literature 3, and an optical contact method as disclosed in Patent Literature 4. The optical contact method prepares substrates having precisely polished glass surfaces, and tightly adheres the glass surfaces to each other.

When a crystal substrate (workpiece) is bonded to a glass substrate (workpiece), these two workpieces are laminated (stacked) and heated while being pressurized as disclosed in Patent Literature 5, for example. Although a bonding mechanism is not entirely clear in Patent Literature 5, it is assumed that the workpiece surfaces which are activated by the heating are combined to each other by the pressurizing, and the workpieces are joined to each other.

In another method, the surfaces of the quartz substrates are mirror polished and/or chemically cleaned (washed) to smooth or flat surfaces which are terminated with OH groups (radicals), and then the two substrates (workpieces) are laminated and heated, as disclosed in Patent Literature 6, for example.

In yet another method, an $SiO_2$ film is formed on the joining surface of the glass substrate, and the glass substrate is directly joined to the crystal substrate by means of interatomic bond, as disclosed in Patent Literature 7.

In still another method of boding the workpieces, fine crystal continuous thin films are provided on the joining surfaces of the respective workpieces, the workpieces are laminated, atomic diffusion is forced to occur on the joining interfaces of the fine crystal continuous thin films and the grain boundaries thereof, and the workpieces are joined to each other, as disclosed in Patent Literature 8, for example.

In recent years, use of this atomic diffusion joining method to join the quartz substrates of a quartz device was reported by KYOCERA KINSEKI Corporation and Takehito Shimatsu of Tohoku University.

LISTING OF REFERENCES

Patent Literatures

PATENT LITERATURE 1: Japanese Patent Application Laid-Open Publication No. 2003-29035A
PATENT LITERATURE 2: Japanese Patent Application Laid-Open Publication No. 2010-243966A
PATENT LITERATURE 3: Japanese Patent Application Laid-Open Publication No. 2007-297249A
PATENT LITERATURE 4: Japanese Patent Application Laid-Open Publication No. Hei 9-221342A
PATENT LITERATURE 5: Japanese Patent Application Laid-Open Publication No. 2009-280420A
PATENT LITERATURE 6: Japanese Patent Application Laid-Open Publication No. Hei 6-21741A
PATENT LITERATURE 7: Japanese Patent Application Laid-Open Publication No. 2007-41117A
PATENT LITERATURE 8: Japanese Patent Application Laid-Open Publication No. 2010-46696A

SUMMARY OF THE INVENTION

Problems to be Solved

The above-described joining methods have various problems. When two glass substrates are bonded to each other to form an optical element, when a glass substrate is bonded to a crystal substrate to form an optical element, and when one crystal substrate is bonded to another crystal substrate to form an optical element are discussed below as examples.

If a common bonding agent or an ultraviolet curing adhesive is used, the bonding agent (adhesive) should be applied on the joining surface at a uniform density and a uniform thickness. However, the precision of the bonding agent application is not always high. Thus, bubbles are often generated in the bonding agent, and the film thickness of the bonding agent over the joining surface often has irregularities. Accordingly, the workpieces after the joining tend to possess different optical features.

The wavelength range of the light passing the bonding agent is not always wide, and therefore the bonding agent itself restricts the optical features of the optical element per se. Furthermore, the durability of the bonding agent is not sufficient. If the ultraviolet light passes a certain type of bonding agent, the bonding agent may be deteriorated by the ultraviolet light.

When the method of providing the low melting point glass frit between the joining surfaces and bonding the workpieces by fusion is used, it is still difficult to apply the frit (powder) on the joining surfaces at the uniform density and the uniform thickness. Thus, the above-mentioned shortcoming of different optical features may result. The difference in thermal expansion coefficient between the glass substrate and the low melting point glass frit may create distortions in the optical element itself.

The optical contact method does not use the bonding agent and the above-described problems caused by the bonding agent would not occur, nevertheless it is necessary to polish the joining surfaces at high precision to provide highly precise surfaces. This increases the manufacturing cost.

The optical low pass filter for preventing the moire is constituted by, for example, a plurality of laminated quartz birefringent plates which have different optical axes and/or laminated quartz plates such as quarterwave (¼) plates. When the optical element is fabricated by bonding the two crystal substrates to each other, the lamination of the workpieces is carried out such that the crystal orientation of one workpiece is different from the crystal orientation of the other workpiece. In order to obtain desired optical features, therefore, the positioning (alignment) should be performed based on the crystal orientations of the crystal substrates.

The bonding method of Patent Literature 5 includes a step of pressurizing the workpieces. Thus, a large-scale pressurizing mechanism is needed to pressurize the workpieces when the workpieces are bonded to each other.

The method of Patent Literature 6 includes many pre-treatments prior to the bonding process, such as mirror working (finishing) of the surfaces, the cleaning (washing) with a detergent (cleaning substance), the cleaning (washing) with isopropyl alcohol, and the cleaning (washing) with a liquid mixture containing sulfuric acid or hydrogen peroxide water. After the pre-treatment, the bonding process also includes many steps such as heating the workpieces to have OH group (radical) terminated surfaces, pressurizing, and subsequent heating. Thus, the workpiece bonding process becomes complicated.

If the $SiO_2$ film is formed on the joining surface of the glass substrate, and the glass substrate is directly bonded to the crystal substrate by means of interatomic bond, as disclosed in Patent Literature 7, or if the atomic diffusion joining method of Patent Literature 8 is used to provide fine crystal continuous thin films (metallic thin films) on the respective joining surfaces of the quartz substrates, and the quartz substrates are joined to each other, then an intervening substance, which is not the workpiece, should be provided on the joining surface(s). Accordingly, the workpiece bonding process must include a step of depositing the intervening substance on the joining surface(s). This deposition step requires a large-scale apparatus, and makes the workpiece bonding process complicated.

The present invention was developed in view of the above-described facts, and an object of the present invention is to provide a workpiece bonding method for bonding and joining two substrates (workpieces) to each other, that can ensure the joining uniformity, suppress the deteriorations in the optical features of the workpieces due to use of the bonding agent or the low temperature glass frit, does not need the high precision polishing to the workpiece surfaces which is required in the optical contact method, does not need the intervening substance on the joining surface(s) which is required in the atomic diffusion joining method, and can reduce or eliminate defects and failure such as misalignment due to the pressurizing or the thermal expansion, and workpiece breakage, and to provide a workpiece bonding device for performing the workpiece bonding method.

Solution to the Problems

In order to achieve the above-mentioned object, a workpiece bonding method of bonding a first workpiece and a second workpiece to each other, such as a crystal substrate (e.g., quartz substrate) and another crystal substrate, a crystal substrate and a glass substrate, and a glass substrate and another glass substrate, according to one aspect of the present invention includes the following steps.

Step I

In the atmosphere, the joining surfaces of the first and second workpieces (a crystal substrate and a glass substrate, or two glass substrates) are irradiated with vacuum ultraviolet light having a wavelength of 200 nm or less. Both of the joining surfaces of the two workpieces are irradiated with the vacuum ultraviolet light.

Step II

The joining surfaces, which are irradiated with the vacuum ultraviolet light, are faced each other and the positioning (alignment) is performed. After the positioning, the two workpieces are laminated such that the joining surfaces contact each other.

Step III

After the lamination, the workpieces are heated, without performing a pressurizing step, i.e., without pressurizing the laminated workpieces, such that the workpiece temperature rises to a predetermined temperature. This temperature is maintained until the joining is completed.

Upon heating, the laminated workpieces enter a thermally expanded (thermal expansion) state, and joined to each other in this state. After the heating, the temperature of the laminated workpieces drops to the room temperature, and a stress is generated in the laminated workpieces. The magnitude of this stress depends on the temperature difference between the workpiece temperature upon the heating, and the room temperature. The above-mentioned predetermined temperature is a heating temperature that can avoid the breakage of the laminated workpieces due to the stress when the workpiece temperature drops to the room temperature after the heating. It should be noted that after the lamination the workpieces may be pressurized (with a small pushing force) in order to adapt the joining surfaces to each other.

The joining mechanism in the STEPs I to III is not entirely clear, but the inventors assume that the following phenomena take place during the joining.

When the joining surfaces of the first and second workpieces (two crystal substrates, a crystal substrate and a glass substrate, or two glass substrates) are irradiated with the vacuum ultraviolet light having a wavelength of 200 nm or less in the atmosphere, the oxygen in the atmosphere is decomposed on the substrate surfaces by the irradiation of the vacuum ultraviolet light, and active (radical) oxygen is generated. This active oxygen reacts with organic substance-based impurities attached on the surfaces of the first and second workpieces, and removes (eliminates) the organic substance-based impurities.

In addition, the active oxygen oxidizes the joining surfaces of the first and second workpieces, and silicon atoms of the crystal substrate(s) or the glass substrate(s) of the first and second workpieces combine with the active oxygen. Moisture exists in the atmosphere, and the active oxygen combines with hydrogen contained in the moisture. As a result, the silicon atoms combine with a hydroxy group or groups (OH group(s)) on the surfaces of the first and second workpieces (i.e., the surfaces of the first and second workpieces are terminated with the OH group(s)).

When the first and second workpieces are laminated such that the joining surfaces of the first and second workpieces, which are irradiated with the vacuum ultraviolet light, contact each other in the STEP II, the two workpieces are laminated and the surfaces of the two workpieces which are terminated with the OH group(s) contact each other. Accordingly, the hydrogen bond is formed by the OH groups of the two workpieces.

Furthermore, because the laminated first and second workpieces are heated in the STEP III, the inventors assume that dehydration takes place on the joining surfaces, and ultimately the first workpiece is joined to the second workpiece by the covalent bond of the oxygen.

When the first and second workpieces are the two crystal substrates, the crystal substrate and the glass substrate, or the two glass substrates, experiments revealed that the joining was achieved (succeeded) under the condition of the heating temperature being 200 degrees C. or higher.

If the heating temperature is too high, however, a pair of workpieces joined may crack due to the stress generated when the temperature of the heated substrates returns to the room temperature.

Because the quartz substrates have crystal orientations, the temperature for triggering the cracking may be different from the first workpiece to the second workpiece, depending upon the directions of the crystal orientations of the laminated first and second substrates, if the first and second workpieces are the quartz substrates.

When the first and second workpieces were the quartz substrates and the directions of the crystal orientations of these two quartz substrates were parallel to each other, no cracking occurred even when the heating temperature became 300 degrees C. or higher. On the other hand, when the two workpieces were laminated such that the directions of the crystal orientations crossed each other, cracking occurred in certain cases when the heating temperature exceeded 300 degrees C. Therefore, the heating temperature is preferably equal to or lower than 300 degrees C. when the two quartz substrates are laminated such that the directions of the crystal orientations of the two quartz substrates cross each other.

If inorganic (mineral) substance-based impurities possibly adhere on the surfaces of the first and second workpieces, the surfaces of the first and second workpieces may be cleaned by megasonic cleaning after the joining surfaces of the first and second workpieces are irradiated with the vacuum ultraviolet light having a wavelength of 200 nm or less in the STEP I. For example, ultrasonic vibrations at 1-2 MHz may be imparted to a pure (purified) water stream injected from a nozzle or the like, and the pure water stream may be directed to the workpiece surfaces. The pure water stream serves as a medium for carrying the ultrasonic wave and also as a medium for conveying contaminants peeled from the workpiece surfaces by the ultrasonic wave. After the pure water stream impinges on the joining surfaces of the first and second workpieces, the pure water remaining on the joining surfaces of the first and second workpieces is removed by blowing a cleaning gas stream against the joining surfaces of the first and second workpieces.

It should be noted that the megasonic cleaning intends to mechanically remove the inorganic substance-based impurities adhering on the surfaces of the first and second workpieces, as described above. Even if the megasonic cleaning is carried out after the STEP I, no changes would take place on the surfaces of the first and second workpieces which are terminated with the OH groups.

It should be noted that when the laminated first and second workpieces are heated by a heating device, the transition from the STEP II to the STEP III may smoothly proceed if the heating device is heated in advance.

When the first and second workpieces are laminated, part (one side) of the first workpiece may firstly be brought into contact with the second workpiece, and then the entire joining surface of the first workpiece may gradually be brought into contact with the joining surface of the second workpiece. Alternatively, the joining surface of the first workpiece may be bent to have a convex shape, the peak of the bent joining surface of the first workpiece may be brought into contact with the joining surface of the second workpiece, and the bending may be released to bring the entire joining surface of the first workpiece into contact with the joining surface of the second workpiece. This eliminates the air from the laminating interface of the two workpieces.

A device for bonding the first and second workpieces to each other has the following configuration.

(1) According to a first aspect of the present invention, the bonding device includes a first stage configured to hold the first workpiece, and a second stage configured to hold the second workpiece. The bonding device also includes a light irradiating unit configured to irradiate the surface of the first workpiece and/or the surface of the second workpiece with ultraviolet light. The bonding device also includes a workpiece laminating mechanism configured to laminate the first and second workpieces such that the irradiated surface of one of the first and second workpieces which are held by the first and second stages contacts, at least, the surface of the other workpiece or the irradiated surface of the other workpiece. The bonding device also includes a gap setting mechanism configured to adjust the distance between the surface of the first workpiece held by the first stage and the light irradiating unit, and the distance between the surface of the second workpiece held by the second stage and the light irradiating unit. The bonding device also includes a heating mechanism provided separately from the first and second stages and configured to heat the laminated first and second workpieces.

(2) According to a second aspect of the present invention, the heating mechanism of the first aspect of the invention may include a heating stage on which the workpieces are placed.

(3) The bonding device according to the first or second aspect of the invention may further include a megasonic cleaning device that includes a pure water stream injecting unit and a gas discharging unit. The pure water stream injecting unit is provided separately from the first and second stages, and configured to inject the pure water stream, to which supersonic vibrations are imparted, toward the irradiated surface of one of the first and second workpieces held by the first and second stages.

Advantageous Effects of the Invention

The bonding method of the present invention has the following advantages.

(1) Because neither a normal bonding agent nor an ultraviolet curing adhesive are used for the joining, the optical features of the workpieces do not have irregularities, after the joining, due to bubbles that would be otherwise generated in the bonding agent and/or uneven film thickness of the bonding agent. In addition, the optical features are not restricted by the characteristic (properties) of the bonding agent itself, and the deteriorations of the bonding agent due to the ultraviolet light would not occur.

Furthermore, no distortions would occur in the laminated workpieces due to the difference in the thermal expansion coefficient between the low melting point glass frit and the quartz substrate (or the glass substrate) when the workpieces are joined to each other by fusion, with the low melting point glass frit being interposed.

(2) The bonding method of the present invention does not include a step of pressurizing the laminated first and second workpieces. Therefore, a large-scale pressurizing mechanism for pressing the workpieces is not required when the workpieces are bonded to each other.

(3) The bonding method of the present invention does not include the pre-treatments such as those disclosed in Patent Literature 6, and does not perform a heating step for a long time such as one hour. The bonding method irradiates the workpiece surfaces with the vacuum ultraviolet light having a wavelength of 200 nm to clean (wash) the workpiece surfaces and obtain the workpieces having the OH groups terminated surfaces. The irradiation time of the vacuum ultraviolet light is, for example, some 90 seconds. In other words, the boding method of the present invention can clean the workpiece surfaces and provide the workpieces with the OH group terminated surfaces by a single step of irradiating the workpiece surfaces with the vacuum ultraviolet light for a short time.

On the contrary, the method of Patent Literature 6 performs the pre-treatments prior to the bonding process, such as the cleaning with the cleaning material, the cleaning with isopropyl alcohol, and the cleaning with a liquid mixture containing sulfuric acid or hydrogen peroxide water, and then performs the heating step for heating the two workpieces in order to provide the bonded two workpieces with the OH group terminated surfaces. In other words, the complicated pre-treatments prior to the bonding process, such as the cleaning with isopropyl alcohol and the cleaning with a liquid mixture containing sulfuric acid or hydrogen peroxide water, are used to remove the organic substance-based impurities adhering on the workpiece surfaces. Also, in order to remove the water molecules from the workpiece surfaces, the workpieces are heated to, for example, 300 degrees C. and maintained at 300 degrees C. for one hour before the workpieces are joined to each other, such that the workpieces have the OH group terminated surfaces. Therefore, the method of Patent Literature 6 requires a longer time in the pre-treatments and includes the complicated treatments in the pre-treatments, as compared to the present invention.

(4) Unlike the method of Patent Literature 7, the boding method of the present invention does not need to form an $SiO_2$ film on the joining surface of the glass substrate when the glass substrate is directly joined to the crystal substrate by means of interatomic bond. Unlike the method that uses the atomic diffusion joining method of Patent Literature 8, the boding method of the present invention does not need to provide fine crystal continuous thin films (metallic thin films) on the joining surfaces of the quartz substrates.

In other words, because the bonding method of the present invention does not put the above-described intervening substances on the joining surfaces of the first and second workpieces, the bonding method of the present invention does not need a step of depositing the intervening substance on the joining surfaces, and does not need a large-scale apparatus for carrying out such deposition step.

(5) When both of the first and second workpieces are the quartz substrates and laminated (stacked) such that the directions of the crystal axes of the first and second workpieces cross each other, it is possible to prevent the cracking of the workpieces if the heating temperature after the lamination is controlled to be equal to or lower than 300 degrees C.

(6) When the two workpieces are heated by a heating unit that is heated beforehand, the transition from the laminating step to the heating step can be made in a short time, and the time for the bonding can be reduced.

(7) It is possible to remove the air from the laminated surfaces of the first and second workpieces by firstly bringing part (one side) of the first workpiece into contact with the second workpiece and then gradually bringing the entire joining surface of the first workpiece into contact with the joining surface of the second workpiece, or alternatively by bending the first workpiece such that the joining surface of the first workpiece has a convex shape, bringing the peak of the bent joining surface of the first workpiece into contact with the joining surface of the second workpiece, releasing the bending, and bringing the entire joining surface of the first workpiece into contact with the joining surface of the second workpiece. As a result of removing the air from the laminated surfaces of the two workpieces, it is possible to securely bond the two workpieces to each other, and the optical features are not deteriorated after the joining.

(8) It is possible to remove the inorganic substance-based impurities from the surfaces of the first and second workpieces by megasonic cleaning (washing) the surfaces of the first and second workpieces before the first and second workpieces are laminated such that the joining surfaces of the first and second workpieces contact each other after irradiating the surfaces of the first and second workpieces with the vacuum ultraviolet light. As a result of removing the inorganic substance-based impurities, it is possible to securely bond the two workpieces to each other.

DETAILED DESCRIPTION OF THE INVENTION

I. Bonding Device

A bonding device for carrying out a workpiece bonding method according to one embodiment of the present invention will be described below. The bonding device of the present embodiment is an exemplary configuration that has a function of removing inorganic substance-based impurities on the workpiece(s) between the STEP I and the STEP II. It should be noted that if the inorganic substance-based impurities do not exist on the workpiece(s) prior to the bonding process, or almost no inorganic substance-based impurities exist, then the function of removing the inorganic substance-based impurities is unnecessary.

The workpiece bonding device generally includes a light irradiating mechanism A, a workpiece cleaning and laminating mechanism B, a workpiece conveying mechanism C, and a workpiece heating mechanism D.

The light irradiating mechanism A is a mechanism for performing the above-described STEP I. The workpiece cleaning and laminating mechanism B is a mechanism for performing a step of removing the inorganic substance-based impurities on the workpieces after the STEP I, and performing the STEP II. The workpiece heating mechanism D is a mechanism for performing the STEP III. The workpiece conveying mechanism C is a mechanism for conveying the workpieces, to which the STEP I is performed by the light irradiating mechanism A, to the workpiece cleaning and laminating mechanism B, and for conveying the workpieces, to which the STEP II is performed by the workpiece cleaning and laminating mechanism B, to the workpiece heating mechanism D.

1. Light Irradiating Mechanism A and Workpiece Conveying Mechanism C

Figure 1:
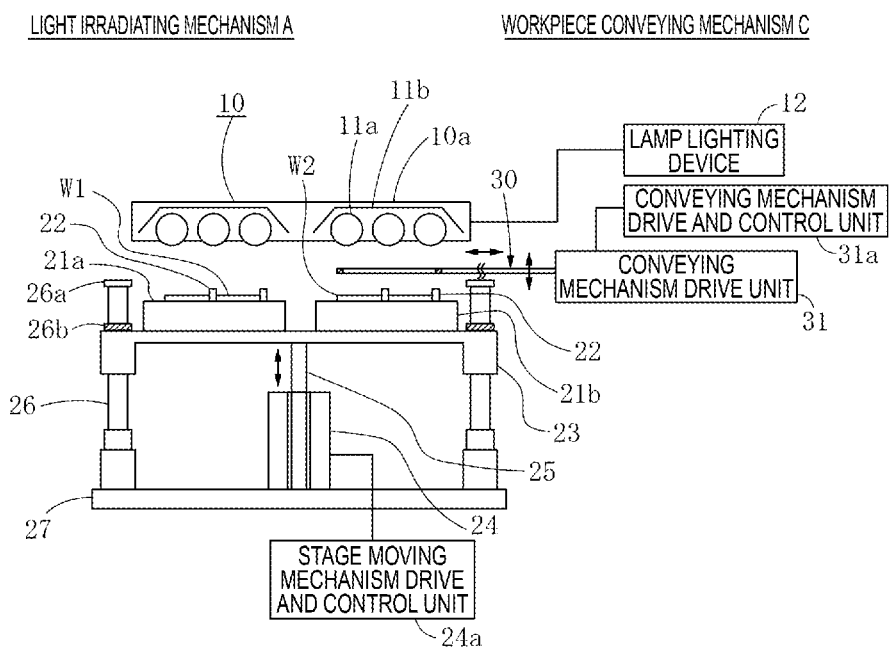
FIG. 1 shows an exemplary configuration of a light irradiating mechanism and a workpiece conveying mechanism.

FIG. 1 shows an exemplary configuration of the light irradiating mechanism A and the workpiece conveying mechanism C.

A light irradiating unit 10 is configured to irradiate the surface (joining surface) of a first workpiece W1 and a surface (joining surface) of a second workpiece W2 with vacuum ultraviolet light to remove organic substance-based impurities from the surfaces of the two workpieces W1 and W2, and to provide the two workpieces W1 and W2 with OH group terminated surfaces. The light irradiating unit 10 has at least one lamp 11a for each workpiece, a reflection mirror 11b for reflecting light emitted from the lamp(s) 11a toward the associated workpiece (downward in FIG. 1) for each workpiece, and a lamp housing 10a for housing the lamps 11a and the reflection mirrors 11b.

In FIG. 1, a plurality of lamps 11a and reflection mirrors 11b are housed in the lamp housing 10a such that the light irradiating unit can irradiate both of the first workpiece W1 and the second workpiece W2 with the vacuum ultraviolet light.

The lamp 11a is, for example, a vacuum ultraviolet excimer lamp that emits monochromatic light having a center wavelength of 172 nm. The lighting control to each lamp 11a of the light irradiating unit 10 is performed by a lamp lighting unit 12. Specifically, the lamp lighting unit 12 has, among other functions, a function of adjusting the intensity of the UV (ultraviolet) light emitted from the lamps 11a by controlling the lighting and extinguishing of the lamps 11a, and adjusting an amount of electricity to be supplied to the lamps 11a.

The first workpiece W1 is placed on a first workpiece stage 21a such that that face of the first workpiece W1 which will be irradiated with the UV light faces (opposes) the light irradiating unit 10. Likewise, the second workpiece W2 is placed on a second workpiece stage 21b such that that face of the second workpiece W2 which will be irradiated with the UV light faces the light irradiating unit 10.

It should be noted that the first and second workpiece stages 21a and 21b may be provided with positioning pins 22 to position the first and second workpieces W1 and W2 respectively, if necessary. When the shape of each of the first and second workpieces W1 and W2 is quadrangular, three positioning pins 22 are provided. Out of these three pins, one pin is associated with a short side of the quadrangular workpiece, and the other two pins are associated with long sides of the quadrangular workpiece.

The workpiece conveying mechanism C is configured to convey the first and second workpieces W1 and W2, which are stored in a workpiece storage mechanism (not shown), such that the first workpiece W1 is placed on the first workpiece stage 21a and the second workpiece W2 is placed on the second workpiece stage 21b, and convey the first and second workpieces W1 and W2, which are irradiated with the vacuum ultraviolet light emitted from the light irradiating unit 10, to the workpiece cleaning and laminating mechanism B. The workpiece conveying mechanism C includes a conveying unit 30 configured to catch (clamp) and convey the workpiece, a drive unit 31 configured to drive the conveying unit 30 (i.e., conveying mechanism drive unit 31), and a drive and control unit 31a for driving and controlling the conveying mechanism drive unit.

When the bonding device shown in FIG. 1 is installed in the atmosphere, the UV light having a wavelength of 172 nm applied to the first and second workpieces W1 and W2 from the light irradiating unit 10 significantly attenuates in the atmosphere. Therefore, it is necessary that the light irradiating unit 10 is close to the surface of the first workpiece W1 and the surface of the second workpiece W2 in the atmosphere to a certain extent.

In other words, when the above-described irradiation is performed, it is preferred that the first workpiece stage 21a on which the first workpiece W1 is placed and the second workpiece stage 21b on which the second workpiece W2 is placed have a moving capability to allow the surface of the first workpiece W1 to approach the light irradiating unit 10 to a certain extent and to allow the surface of the second workpiece W2 to approach the light irradiating unit 10 to a certain extent.

To meet such demand, the first workpiece stage 21a and the second workpiece stage 21b are provided on the movable stage 23.

Two column-like posts 26 penetrate the movable stage 23. Those portions of the movable stage 23 through which the posts 26 penetrate have bearing structures such that the movable stage 23 can move in a linear direction (i.e., up and down direction) which is defined by the posts 26.

A flange portion 26a is provided on top of each of the posts 26. Between the flange portion 26a of each post 26 and the movable stage 23, there is inserted a height adjustment collar 26b. As will be described later, it is possible to adjust the height of the movable stage 23 from the base 27 (distance between the surfaces of the first and second workpieces W1 and W2 on the movable stage 23 and the light irradiating unit 10) by adjusting the thickness of each of the height adjustment collars 26b.

A lower face of the movable stage 23 is connected to a stage moving mechanism 24 that includes, for example, an air cylinder. As the stage moving mechanism 24 is driven, the movable stage 23, and the first workpiece stage 21a and the second workpiece stage 21b placed on the movable stage 23 move up and down with a drive shaft 25. The movements of the stage moving mechanism 24 are controlled by a stage moving mechanism drive and control unit 24a.

2. Workpiece Cleaning and Laminating Mechanism B

Figure 2:
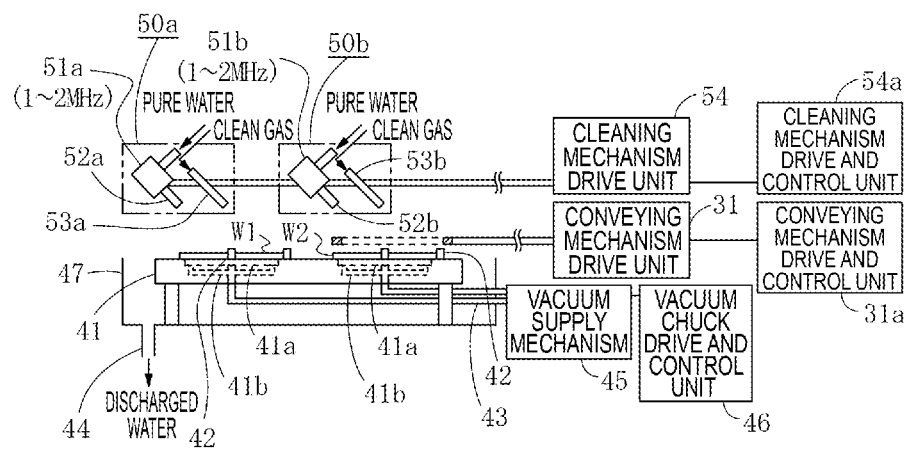
FIG. 2 shows an exemplary configuration of a workpiece cleaning and laminating mechanism and the workpiece conveying mechanism.
Figure 3:
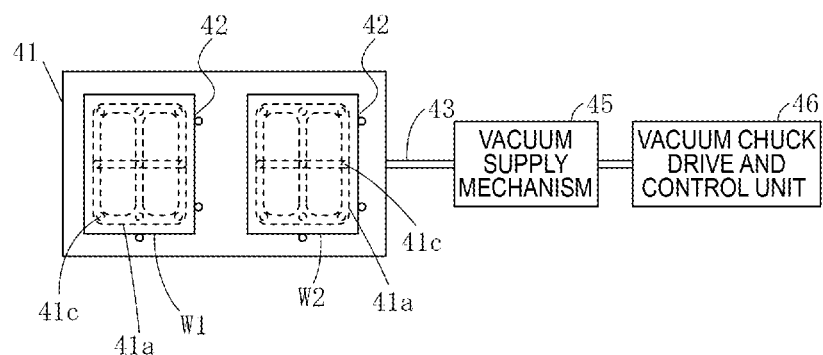
FIG. 3 is a top view of a suction stage of the workpiece cleaning and laminating mechanism.

FIG. 2 shows an exemplary configuration of the workpiece cleaning and laminating mechanism B. FIG. 3 shows a top view of a suction stage of the workpiece cleaning and laminating mechanism B.

The first and second workpieces W1 and W2, which are conveyed from the light irradiating mechanism A by the workpiece conveying mechanism C, are placed on the suction stage 41, and a suction chucking mechanism of the suction stage 41 can hold the placed first and second workpieces W1 and W2 by a suction force.

Positioning pins 42 are provided on the suction stage 41 to position the first and second workpieces W1 and W2, respectively. If each of the first and second workpieces W1 and W2 has a quadrangular shape, three position pins 42 are provided for each workpiece. One of the three pins 42 is associated with a short side of the quadrangular workpiece, and the remaining two pins 42 are associated with the two long sides of the quadrangular workpiece.

As shown in FIG. 3, grooves or recesses 41a for suction are formed in placement areas of the first and second workpieces W1 and W2, which are positioned by the positioning pins 42, in the workpiece placement surface of the suction stage 41. The suction grooves 41a have shapes that correspond to the shapes of the first and second workpieces W1 and W2.

Vacuum (or negative pressure) supply paths 41b are formed in the suction stage 41 as indicated by the broken line in FIG. 2. One end of each vacuum supply path 41b is connected to a vacuum supply tube 43, and the other end of the vacuum supply path 41b is communicated with a vacuum supply hole 41c (see FIG. 3) formed in the suction groove 41a.

When the first and second workpieces W1 and W2 are placed on the suction stage 41, vacuum (negative pressure) is supplied to the space defined by the vacuum supply path 41b, the suction groove 41a and the first workpiece placement surface and the space defined by the vacuum supply path 41b, the suction groove 41a and the second workpiece placement surface by the vacuum supply mechanism 45 via the vacuum supply tube 43, i.e., the pressure in these spaces is reduced. As a result, the first and second workpieces W1 and W2 are held on the suction stage 41 by the suction force. The movements of the vacuum chucking mechanism are controlled as the vacuum chuck drive and control unit 46 controls the movements of the vacuum supply mechanism 45.

The workpiece cleaning and laminating mechanism B has a megasonic cleaning mechanism 50a for removing the inorganic substance-based impurities from the surface of the first second workpiece W1, and a megasonic cleaning mechanism 50b for removing the inorganic substance-based impurities from the surfaces of the second workpiece W2. The megasonic cleaning mechanism 50a and 50b have water stream nozzles 52a and 52b for injecting pure water, to which 1-2 MHz supersonic vibrations are imparted, and gas nozzles 53a and 53b for injecting clean gas, respectively. The water stream nozzles 52a and 52b have supersonic vibrators (transducers) 51a and 51b for imparting vibrations having a 1-2 MHz frequency. The pure water supplied to the water stream nozzles 52a and 52b is imparted the supersonic vibrations by the supersonic vibrators 51a and 51b, and is injected from the water stream nozzles 52a and 52b.

The cleaning mechanism drive unit 54 is configured to drive the megasonic cleaning mechanisms 50a and 50b, and can supply the pure water to the water stream nozzles 52a and 52b from a pure water feed unit (not shown), supply the clean gas to the gas nozzles 53a and 52b from a clean gas feed unit (not shown), drive the supersonic vibrators 51a and 51b, and move the water stream nozzles 52a and 52b and the gas nozzles 53a and 53b to desired positions. The cleaning mechanism drive unit 54 is controlled by a cleaning mechanism drive and control unit 54a.

The suction stage 41 is provided in a sink 47. The pure water stream injected (directed) toward the first and second workpieces W1 and W2 from the megasonic cleaning mechanisms 50a and 50b exfoliates the inorganic substance-based impurities attached to the first and second workpieces W1 and W2 and carries the exfoliated contaminants out of the workpieces W1 and W2. In other words, the pure water that contains the contaminants is collected in the sink 47 and discharged to the outside via a water discharge drain 44 of the sink 47.

The workpiece conveying mechanism C is configured to convey the first workpiece W1 and the second workpiece W2 from the light irradiating mechanism A into the workpiece cleaning and laminating mechanism B, and place the first and second workpieces W1 and W2 on the suction stage 41, as described above. The conveying mechanism C is also used to convey the first workpiece W1 so as to laminate the first workpiece W1 on the second workpiece W2.

Specifically, the workpiece conveying mechanism C has a function of clamping and holding the first workpiece W1, a function of turning over the first workpiece W1 such that the irradiated surface of the first workpiece W1 (the surface cleaned by the megasonic cleaning mechanism) faces a plane which contains the irradiated surface of the second workpiece W2 (the surface cleaned by the megasonic cleaning mechanism), a function of conveying the turned-over first workpiece W1 above the second workpiece W2, and a function of laminating the first workpiece W1 on the second workpiece W2 such that the irradiated surface of the first workpiece W1 contacts the irradiated surface of the second workpiece W2.

When the first and second workpieces W1 and W2 are the crystal substrates such as quartz substrates, and the first workpiece W1 is laminated on the second workpiece W2, the crystal axis directions of the two workpieces should match each other (should align with each other).

This alignment may be carried out with the positioning pins 42 provided on the suction stage 41. Alternatively, this alignment may be carried out by the workpiece conveying mechanism C if the workpiece conveying mechanism C is configured to have an alignment function of positioning the first workpiece W1 relative to the second workpiece W2 in terms of the crystal axis direction before laminating the first workpiece W1 on the second workpiece W2.

3. Workpiece Heating Mechanism D

Figure 4:
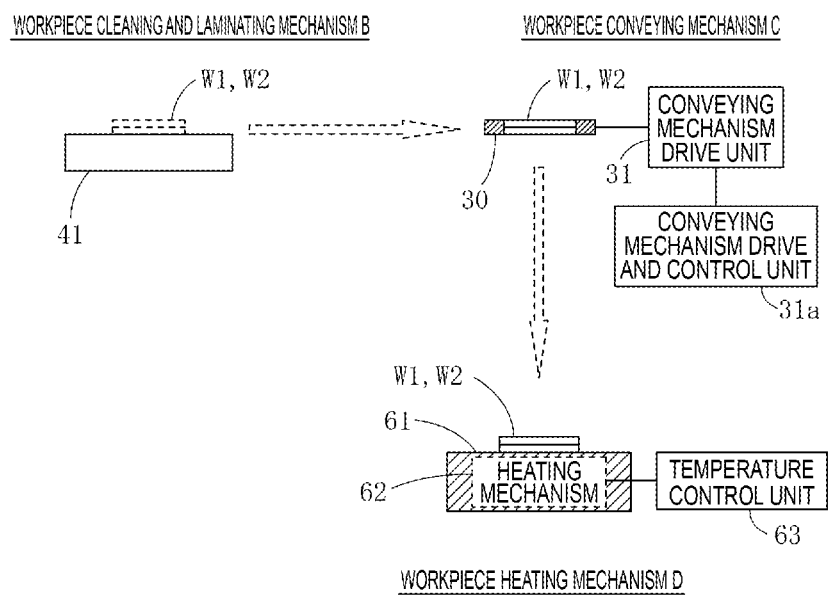
FIG. 4 shows an exemplary configuration of a workpiece heating mechanism.

FIG. 4 illustrates an example of the workpiece heating mechanism D.

The workpiece conveying mechanism C also has a function of further conveying the two workpieces W1 and W2, which undergo the STEP I and the STEP II and are united by the light irradiating mechanism A and the workpiece cleaning and laminating mechanism B, to the workpiece heating mechanism D shown in FIG. 4.

For example, the workpiece storage mechanism (not shown), the light irradiating mechanism A, the workpiece cleaning and laminating mechanism B, the workpiece heating mechanism D and the like are situated around the workpiece conveying mechanism which a conveying unit 30 of the workpiece conveying mechanism C can access. The conveying unit 30 of the workpiece conveying mechanism C picks up the workpieces W1 and W2 from the workpiece storage mechanism, and conveys the workpieces W1 and W2 to the light irradiating mechanism A. The workpieces W1 and W2 which are irradiated with the vacuum ultraviolet light by the light irradiating mechanism A are clamped by the conveying unit 30 and conveyed to the workpiece cleaning and laminating mechanism B. After the cleaning process, the conveying unit 30 puts the first workpiece W1 on the second workpiece W2. The workpiece conveying mechanism C also conveys the laminated workpieces W1 and W2 to the workpiece heating mechanism D to perform the heating process on the workpieces. After the heating process, the bonding process of the workpieces is complete. The workpieces are then conveyed to and stored in a bonded workpiece storage mechanism (not shown) by the workpiece conveying mechanism C.

A heating stage 61 in the workpiece heating mechanism D heats the laminated first and second workpieces W1 and W2 such that the workpiece temperature rises to a predetermined temperature and is maintained for a predetermined time. Subsequently, the heating stage 61 allows the temperature to drop. The predetermined temperature is a heating temperature that does not cause breakage of the laminated workpieces due to a stress when the workpiece temperature drops to the room temperature after the heating process, as described above. The predetermined time is a time from the start of the workpiece heating process to the completion of the joining process. The completion of the joining process means that sufficient joining is obtained across the entire joining surfaces of the workpieces, as described above.

A heating unit 62 in the heating stage 61 includes, for example, a sheath heater embedded or buried in the heating stage 61. The temperature control to the heating stage 61 is performed by a temperature control unit 63. The temperature control unit 63 controls the heating unit 62 based on temperature information on the surface of the heating stage 61, which is measured by a temperature sensor (not shown), such that the surface temperature of the heating stage 61 becomes a predetermined temperature. A table of correlation data between the surface temperature of the heating stage 61, and the workpiece temperature increase characteristics and the actual workpiece temperature (temperature reached by the workpieces) is stored in the temperature control unit 63 beforehand.

It should be noted that the workpiece heating mechanism D is not limited to the above-described configuration that has the heating stage. For example, the workpiece heating mechanism D may include a heating furnace (not shown). The temperature in the heating furnace may be controlled by a temperature controlling mechanism (not shown).

Now, exemplary operations of the bonding device to carry out the workpiece bonding method according to the embodiment of the present invention will be described.

A. Preparation: Operation 1 (Before Light Irradiation)

In the following description about the bonding of the first and second workpieces W1 and W2 to each other, it is assumed that the first and second workpieces W1 and W2 are quadrangular quartz substrates, and the sides of the workpieces have unique (unambiguous) relationship to the crystal axis directions of the workpieces. In other words, it should be assumed that if the direction of a particular side of the first workpiece W1 substantially matches (aligns with) the direction of a particular side of the second workpiece W2, the crystal axis direction of the first workpiece W1 becomes substantially perpendicular to the crystal axis direction of the second workpiece W2.

(1) The first workpiece W1 is placed on the first workpiece stage 21a and the second workpiece W2 is placed on the second workpiece stage 21b. When the positioning pins 22 are provided on the first workpiece stage 21a and the second workpiece stage 21b, the first workpiece W1 is positioned at a predetermined position by the positioning pins 22 of the first workpiece stage 21a.

Likewise, the second workpiece W2 is positioned at a predetermined position by the positioning pins 22 of the second workpiece stage 21b. The predetermined positions of the first and second workpieces W1 and W2 are the positions at which the first and second workpieces W1 and W2 are irradiated with the vacuum ultraviolet light emitted from the light irradiating unit 10.

Figure 5:
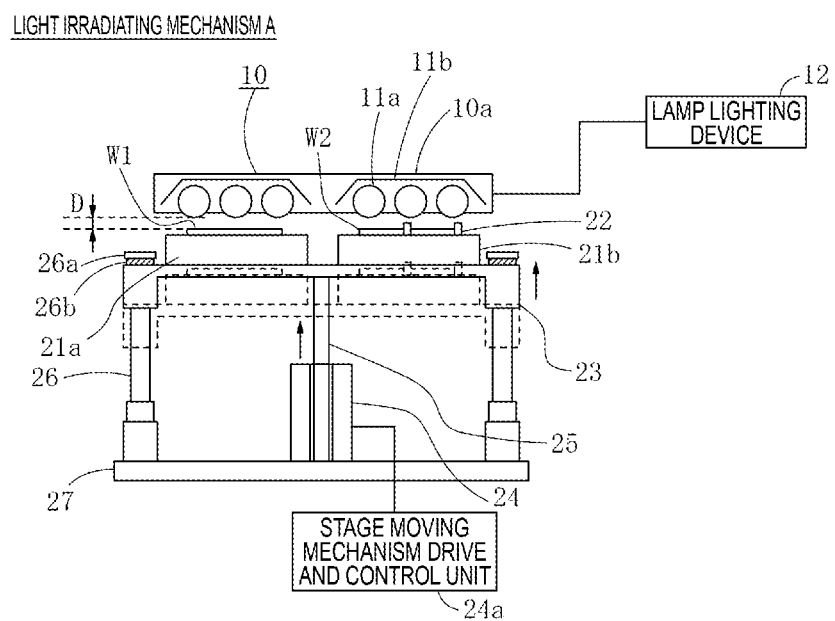
FIG. 5 is a view useful to describe an operation of the light irradiating mechanism.

(2) As shown in FIG. 5, the movable stage 23 is moved as the stage moving mechanism 24 is driven by the stage moving mechanism drive and control unit 24a while the thickness of the first workpiece W1 and the thickness of the second workpiece W2 are taken into account. The movable stage 23 is moved such that the first workpiece stage 21a and the second workpiece stage 21b reach a predetermined height. Specifically, the stage moving mechanism 24 is driven by the stage moving mechanism drive and control unit 24a such that the movable stage 23 moves until the height adjustment collars 26b contact the flange portions 26a of the posts 26.

The predetermined height of the first and second workpiece stages 21a and 21b is the height when the distance between the irradiated surfaces of the first and second workpieces W1 and W2 situated on the first and second workpiece stages 21a and 21b and the lower portions of the lamps 11a becomes a value D. In other words, the height adjustment collars 26b serve as a distance setting mechanism for deciding (setting) the distance between the light irradiating unit 10 and the irradiated surfaces of the first and second workpieces W1 and W2 situated on the first and second workpiece stages 21a and 21b.

The distance D is, for example, 1-5 mm because the UV light at the wavelength of 172 nm emitted from the lamps 11a is significantly attenuated in the atmosphere.

The above-described example is the case where the thickness of the first workpiece W1 is the same as the thickness of the second workpiece W2. In other words, the height of the irradiated surface of the first workpiece W1 from the base 27 is substantially the same as the height of the irradiated surface of the second workpiece W2 from the base 27, and the first and second workpiece stages 21*a* and 21*b* are provided on the single movable stage 23.

When the thickness of the first workpiece W1 is different from the thickness of the second workpiece W2, the moving distance of the first workpiece stage 21*a*, on which the first workpiece W1 is situated, in the up and down direction, is different from the moving distance of the second workpiece stage 21*b*, on which the second workpiece W2 is situated, in the up and down direction. Therefore, two sets of the movable stage 23, a plurality of posts 26 for restricting the moving direction of the movable stage 23, the height adjustment collars 26*b*, the stage moving mechanism 24 and the like, should be provided such that the first workpiece stage 21*a* can move independently from the second workpiece stage 21*b*. In this configuration, it is of course that the thickness of the height adjustment collars 26*b* associated with the first workpiece stage 21*a* is different from the thickness of the height adjustment collars 26*b* associated with the first workpiece stage 21*a*.

(3) On the other hand, in the workpiece heating mechanism D shown in FIG. 4, the temperature of the heating stage 61 is controlled in advance by the temperature control unit 63. Specifically, the temperature control unit 63 controls the heating unit 62 based on temperature information on the surface of the heating stage 61, which is measured by a temperature sensor (not shown), such that the surface temperature of the heating stage 61 becomes a predetermined temperature. As described above, the table of correlation data between the surface temperature of the heating stage 61, and the workpiece temperature increase characteristics and the actual workpiece temperature is stored in the temperature control unit 63 beforehand. When the workpieces are placed on the heating stage 61, the temperature control unit 63 elevates and maintains the temperature of the heating stage 61 based on the stored table such that the workpiece temperature reaches a predetermined temperature (i.e., temperature which does not cause deformations in the workpieces).

The heating stage 61 is heated beforehand in the above-described manner in order to achieve a smooth transition from the STEP II to the STEP III.

The steps (1)-(3) perform the placing and positioning of the first workpiece W1 on the first workpiece stage 21*a*, the placing and positioning of the second workpiece W2 on the second workpiece stage 21*b*, the height adjustment of the first workpiece W1 surface, the height adjustment of the second workpiece W2 surface, and the pre-heating of the heating stage 61.

B. Step I: Operation 2 (Light Irradiation)

(4) The lamps 11*a* are lit by the lamp lighting device 12, the first workpiece W1 is irradiated with the UV light at the wavelength of 172 nm, and the second workpiece W2 is also irradiated with the UV light at the wavelength of 172 nm. The lamp lighting device 12 controls the electricity to be supplied to the lamps 11*a* such that the irradiance on the first workpiece W1 surface and the second workpiece W2 surface become a predetermined value.

(5) When a predetermined irradiation time elapses, the lamp lighting device 12 turns off the lamps 11*a*. It should be noted that the lamp lighting device 12 can also set the lamp lighting time.

The irradiation onto the first and second workpieces W1 and W2 for the predetermined time is performed by the above-described Steps (4) and (5).

It should be noted that although the irradiation onto the first and second workpieces W1 and W2 is simultaneously performed in the Steps (4) and (5), such simultaneous irradiation is not requisite. For example, the first workpiece W1 may firstly be irradiated with the UV light and then the second workpiece W2 may be irradiated with the UV light. Alternatively, the second workpiece W2 may firstly be irradiated with the UV light and then the first workpiece W1 may be irradiated with the UV light.

C. Operation 3 (Conveying and Placing of the Workpieces in the Workpiece Cleaning and Laminating Mechanism B)

Figure 6:
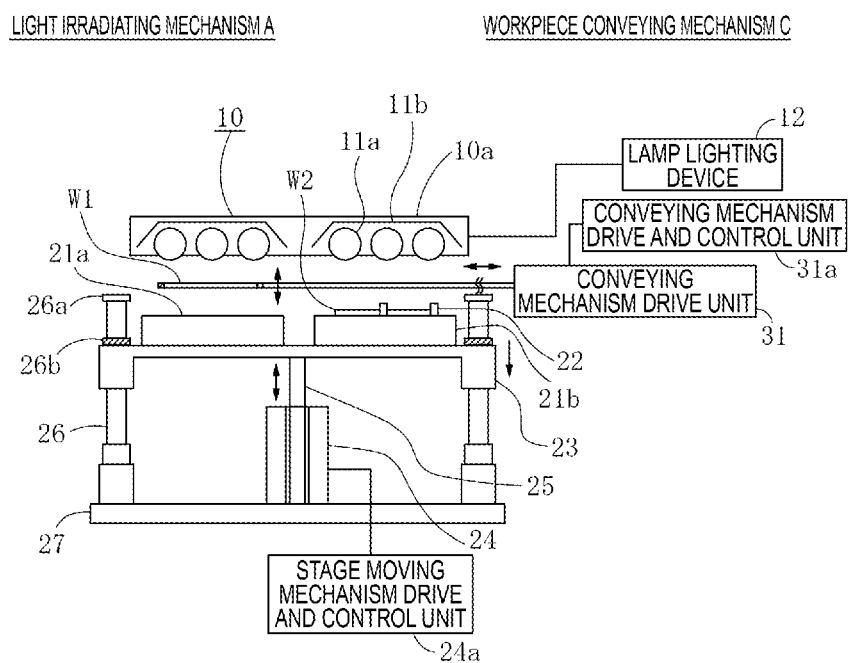
FIG. 6 is a view useful to describe conveyance of the workpieces to the workpiece cleaning and laminating mechanism.

(6) As shown in FIG. 6, the stage moving mechanism 24 is driven by the stage moving mechanism drive and control unit 24*a* to cause the movable stage 23 to descend such that the height of the first workpiece stage 21*a* and the second workpiece stage 21*b* is adjusted to become a predetermined height. The predetermined height prevents the conveying unit 30 of the workpiece conveying mechanism C from colliding with the light irradiating unit 10 and the first and second workpiece stages 21*a* and 21*b* when the conveying unit 30 of the workpiece conveying mechanism C enters and leaves the space between the light irradiating unit 10 and the first and second workpiece stages 21*a* and 21*b*.

(7) The conveying unit 30 of the workpiece conveying mechanism C enters the space between the first and second workpiece stages 21*a* and 21*b* and the light irradiating unit 10, which is located above the first and second workpiece stages, and catches the first workpiece W1.

(8) After catching the first workpiece W1, the conveying unit 30 moves the first workpiece W1 upwards by a predetermined distance to separate the first workpiece W1 from the first workpiece stage 21*a*, and conveys the first workpiece W1 on the suction stage 41 of the workpiece cleaning and laminating mechanism B as shown in FIG. 2. After the first workpiece W1 is positioned by the first workpiece positioning pins 42 provided on the suction stage 41, the first workpiece W1 is placed on the suction stage 41.

(9) Subsequently, the conveying unit 30 of the workpiece conveying mechanism C moves again to the light irradiating mechanism A, and catches the second workpiece W2 on the second workpiece stage 21*b*.

(10) The conveying unit 30 which catches the second workpiece W2 moves the second workpiece W2 upwards by a predetermined distance to separate the second workpiece W2 from the second workpiece stage 21*b*, and conveys the second workpiece W2 above the suction stage 41 of the workpiece cleaning and laminating mechanism B as shown in FIG. 2. After the second workpiece W2 is positioned by the second workpiece positioning pins 42 provided on the suction stage 41, the second workpiece W2 is placed on the suction stage 41.

The positioning pins 42 for the first workpiece W1 and the positioning pins 42 for the second workpiece W2 perform the positioning (decide the positions of the first and second workpieces) such that the first and second workpieces W1 and W2 can be cleaned by the megasonic cleaning mechanism (will be described later).

As will be described later, if the second workpiece positioning pins 42 provided on the suction stage 41 are also used to position the first workpiece W1 relative to the second workpiece W2, the first workpiece positioning pins 42 may be used for preliminary alignment of the first workpiece W1.

Specifically, when the first workpiece W1 caught by the conveying unit 30 of the workpiece conveying mechanism C is turned over by the workpiece conveying mechanism C such that the irradiated surface (cleaned surface) of the first workpiece W1 faces the plane which contains the irradiated surface (surface cleaned by the megasonic cleaning mechanism) of the second workpiece W2, the first workpiece W1 is preliminarily aligned by the first workpiece positioning pins 42 provided on the suction stage 41 such that the crystal axis direction of the turned-over first workpiece W1 matches (aligns with) the crystal axis direction of the second workpiece W2 to a certain extent.

The first and second workpieces W1 and W2 are conveyed to the workpiece cleaning and laminating mechanism B from the light irradiating mechanism A and placed on the suction stage 41 of the workpiece cleaning and laminating mechanism B by the Steps (6) to (10).

D. Operation 4 (Fixing of the Workpieces, and the Megasonic Cleaning)

(11) The vacuum chuck drive and control unit 46 drives the vacuum supply mechanism 45 to supply the vacuum (negative pressure) to the workpiece placement surface of the suction stage 41 via the vacuum supply tube 43. Specifically, the vacuum supply mechanism 45 reduces the pressure in the space defined by the vacuum supply path 41b, the suction groove 41a and the placement surface of the first workpiece W1 via the vacuum supply tube 43, and the pressure in the space defined by the vacuum supply path 41b, the suction groove 41a and the placement surface of the second workpiece W2 via the vacuum supply tube 43. Accordingly, the first and second workpieces W1 and W2 are held on the suction stage 41 by the suction force.

Figure 7:
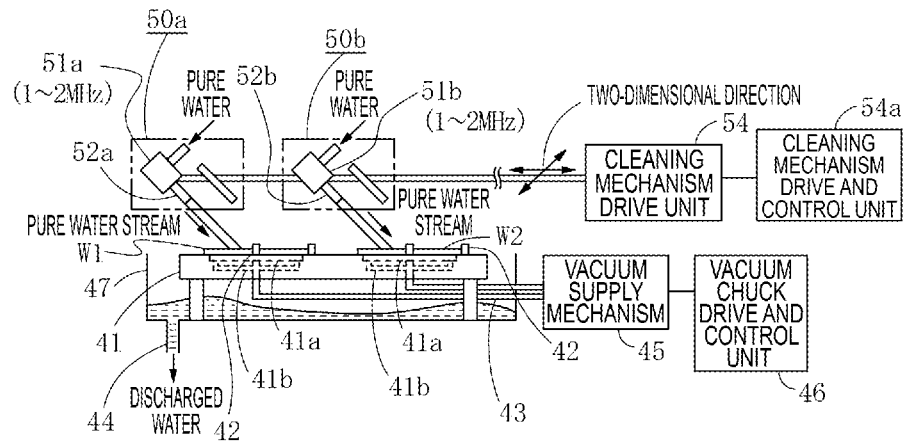
FIG. 7 is a first view useful to describe a megasonic cleaning process by the workpiece cleaning and laminating mechanism.

(12) As illustrated in FIG. 7, the workpiece cleaning and laminating mechanism B drives a megasonic cleaning mechanism 50a and another megasonic cleaning mechanism 50b to position the water stream nozzle 52a for the first workpiece W1 and the water stream nozzle 52b for the second workpiece W2.

(13) Subsequently, the workpiece cleaning and laminating mechanism B supplies the pure water to the water stream nozzles 52a and 52b, and activates the supersonic vibrators 51a and 51b of the megasonic cleaning mechanisms 50a and 50b. Thus, the pure water stream, to which the supersonic vibrations are imparted, is injected toward the first workpiece W1 surface from the water stream nozzle 52a. Also, the pure water stream, to which the supersonic vibrations are imparted, is injected toward the second workpiece W2 surface from the water stream nozzle 52b.

(14) Because the cleaning areas on the first workpiece W1 surface and the second workpiece W2 surface with the pure water are smaller than the surface areas of the first and second workpieces W1 and W2, the workpiece cleaning and laminating mechanism B appropriately moves the water stream nozzles 52a and 52b two-dimensionally in a hypothetical surface which is generally parallel to the first workpiece W1 surface and the second workpiece W2 surface, and cleans the entire surfaces of the first and second workpieces W1 and W2 with the pure water stream to which the supersonic vibrations are imparted.

(15) After cleaning the entire surfaces of the first and second workpieces W1 and W2 with the pure water stream, the workpiece cleaning and laminating mechanism B stops supplying the pure water to the water stream nozzles 52a and 52b, and deactivates the supersonic vibrators 51a and 51b of the megasonic cleaning mechanisms 50a and 50b.

Figure 8:
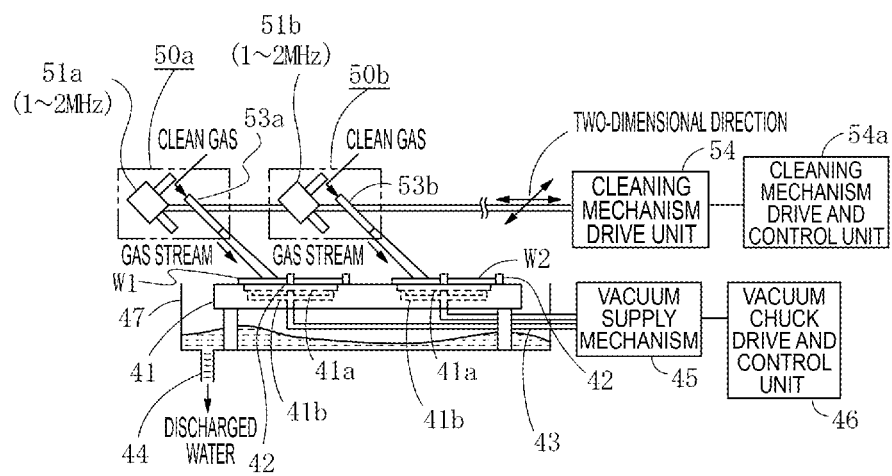
FIG. 8 is a second view to describe the megasonic cleaning process by the workpiece cleaning and laminating mechanism.

(16) As shown in FIG. 8, the workpiece cleaning and laminating mechanism B drives the megasonic cleaning mechanisms 50a and 50b, and positions the gas nozzle 53a for the first workpiece W1 and the gas nozzle 53b for the second workpiece W2.

(17) Subsequently, the workpiece cleaning and laminating mechanism B supplies the clean gas to the gas nozzles 53a and 53b. This causes the clean gas to spout from the gas nozzle 53a toward the first workpiece W1 surface. This also causes the clean gas to spout from the gas nozzle 53b toward the second workpiece W2 surface.

(18) Because the supplying areas of the gas streams on the surfaces of the first and second workpieces W1 and W2 are smaller than the surface areas of the first and second workpieces W1 and W2, the workpiece cleaning and laminating mechanism B appropriately moves the gas nozzles 53a and 53b two-dimensionally in a hypothetical surface which is generally parallel to the surfaces of the first and second workpieces W1 and W2, and injects the clean gas onto the entire surfaces of the first and second workpieces W1 and W2 to remove the pure water remaining on the surfaces of the first and second workpieces W1 and W2.

(19) After removing the residual pure water from the entire surfaces of the first and second workpieces W1 and W2 with the gas streams, the workpiece cleaning and laminating mechanism B stops supplying the clean gas to the gas nozzles 53a and 53b.

The above-described Steps (11)-(19) fix the first and second workpieces W1 and W2 on the suction stage 41 of the workpiece cleaning and laminating mechanism B with the suction force, and use the megasonic cleaning mechanisms 50a and 50b to remove the inorganic substance-based impurities from the surfaces of the first and second workpieces W1 and W2.

The reason why the first and second workpieces W1 and W2 are held on the suction stage 41 with the suction force in the Step (11) prior to the megasonic cleaning step is because the first and second workpieces W1 and W2 should not be moved by the pure water streams and the clean gas streams directed to the first and second workpieces W1 and W2 during the megasonic cleaning step.

The pure water, which is injected toward the first and second workpieces W1 and W2 from the megasonic cleaning mechanisms and contains the inorganic substance-based impurities exfoliated from the surfaces of the first and second workpieces W1 and W2, is collected in the sink 47 and discharged to the outside through the water discharge drain 44 of the sink 47.

E. Step II: Operation 5 (Conveying and Turning Over of the Workpieces)

Figure 9:
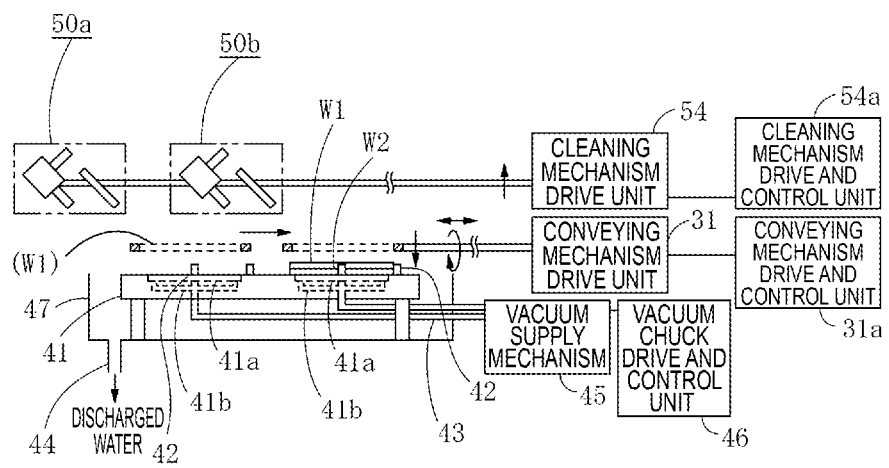
FIG. 9 is a view useful to describe a workpiece conveying process and a workpiece laminating process by the workpiece cleaning and laminating mechanism.
Figure 10A:
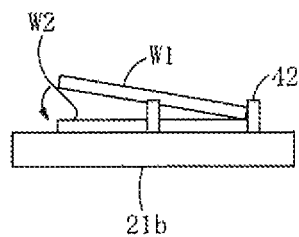
FIG. 10(a) is a side view useful to describe the manner of laminating the workpieces.
Figure 10C:
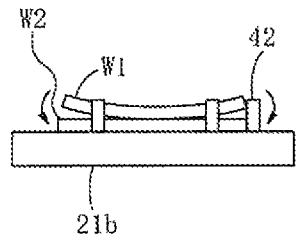
FIG. 10(c) is similar to FIG. 10(a) and illustrates another manner of laminating the workpieces.
Figure 10B:
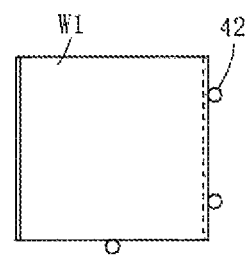
FIG. 10(b) is a top view of FIG. 10(a).
Figure 10D:
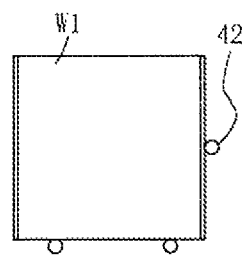
FIG. 10(d) is a top view of FIG. 10(c).

(20) As shown in FIG. 9, the megasonic cleaning mechanisms 50a and 50b are moved upwards as the cleaning mechanism drive unit 54 is driven by the cleaning mechanism drive and control unit 54a, and the adjustment is performed by the cleaning mechanism drive and control unit 54a such that the megasonic cleaning mechanisms 50a and 50b reach a predetermined height. The predetermined height is a height that can avoid the collision of the first workpiece W1 and the conveying unit 30 of the workpiece conveying mechanism C on the megasonic cleaning mechanisms 50a and 50b and the suction stage 41 when the conveying unit 30 of the workpiece conveying mechanism C enters the space between the megasonic cleaning mechanisms and the suction stage 41 and the first workpiece W1 caught by the conveying unit 30 is turned over by the workpiece conveying unit 30 above the suction stage 41.

(21) The conveying unit 30 of the workpiece conveying mechanism C enters the space between the megasonic cleaning mechanisms 50*a* and 50*b* and the suction stage 41 to catch the first workpiece W1.

(22) The conveying unit 30 which catches the first workpiece W1 moves the first workpiece W1 upwards by a predetermined distance, and then turns over the first workpieces W1 such that the irradiated surface (cleaned surface) of the first workpiece W1 faces the plane which contains the irradiated surface (surface cleaned by the megasonic cleaning mechanism) of the second workpiece W2. The predetermined distance is a distance that can avoid the collision of the first workpiece W1 and the conveying unit 30 of the workpiece conveying mechanism C on the megasonic cleaning mechanisms 50*a* and 50*b* and the suction stage 41.

The first workpiece W1 is caught by the conveying unit 30 of the workpiece conveying mechanism C, and is turned over such that the irradiated surface (cleaned surface) of the first workpiece W1 faces the plane that contains the irradiated surface (surface cleaned by the megasonic cleaning mechanism) of the second workpiece W2 in the Steps (21)-(22).

The conveying unit 30 of the workpiece conveying mechanism C is driven by the conveying mechanism drive unit 31 controlled by the conveying mechanism drive and control unit 31*a*.

F. STEP II: Operation 6 (Conveying and Laminating of the Workpieces)

(22) As shown in FIG. 9, the first workpiece W1 turned over by the workpiece conveying mechanism C is conveyed on the second workpiece W2 by the conveying unit 30 of the workpiece conveying mechanism C.

(23) Subsequently, the conveying unit 30 of the workpiece conveying mechanism C positions the first workpiece W1 (in the crystal axis direction) with the second workpiece positioning pins 42, which are used to position the second workpiece W2 on the suction stage 41, and laminates the first workpiece W1 on the second workpiece W2.

Specifically, the conveying unit 30 of the workpiece conveying mechanism C pushes the first workpiece W1 against the positioning pins 42 provided on the suction stage 41 to position the first workpiece W1. The height of the positioning pins 42 provided on the suction stage 41 is greater than the thickness of the second workpiece W2 placed on the suction stage 41.

When the position (crystal axis direction) of the first workpiece W1 is preliminarily aligned before the first workpiece W1 is placed on the suction stage 41 as described above, then the crystal axis direction of the first workpiece W1, which is turned over and conveyed on the second workpiece W2, matches (aligns with) the crystal axis direction of the second workpiece W2 to a certain extent. Thus, when the first workpiece W1 is pushed against the positioning pins 42 provided on the suction stage 41 for the alignment of the first workpiece W1, an amount of movement for the first workpiece W1 in the alignment process is very small.

It should be noted that if the first and second workpieces W1 and W2 should be precisely aligned with each other, alignment marks may be provided on the first and second workpieces W1 and W2 beforehand respectively, and an alignment mark detecting mechanism (not shown) may detect the alignment mark on the first workpiece W1 and the alignment mark on the second workpiece W2. Then, the workpiece conveying unit 30 is driven by the conveying mechanism drive unit 31 under the control of the conveying mechanism drive and control unit 31*a* based on the detection results of the alignment mark detecting mechanism such that the positions of the two alignment marks match each other.

The lamination of the first workpiece W1 on the second workpiece W2 is carried out, for example, in the following manner.

FIGS. 10(*a*) and 10(*b*) illustrate a manner of lamination the two workpieces. FIG. 10(*a*) shows a side view, and FIG. 10(*b*) shows a top view. As shown in FIG. 10(*a*), the workpiece conveying mechanism C holds the first workpiece W1 in an inclined posture. After that side of the first workpiece W1 which extends along the lower position of the inclination is pushed against the two positioning pins 42 of the suction stage 41 for the positioning, the workpiece conveying mechanism C laminates the first workpiece W1 on the second workpiece W2 such that the light receiving surface of the second workpiece W2 gradually contacts the light receiving surface of the first workpiece W1 from the side of the first workpiece W1 which extends along the lower position of the inclination. Such lamination can remove (eliminate) the air from the laminating interface of the two workpieces.

FIGS. 10(*c*) and 10(*d*) illustrate another manner of lamination the two workpieces. FIG. 10(*c*) shows a side view, and FIG. 10(*d*) shows a top view. As shown in FIG. 10(*c*), the workpiece conveying mechanism C holds the first workpiece W1 in a bending posture. This bending is set such that the peak of the convex portion of the bending defines a hypothetical (phantom) line. The workpiece conveying mechanism C pushes that side of the first workpiece W1 which extends in a direction perpendicular to the hypothetical line against the two positioning pins 42 of the suction stage 41 for the positioning, and then brings the first workpiece W1 into contact with the second workpiece W2. Accordingly, the two workpieces make a line contact. The contact line is on the hypothetical line.

With this contact line being the reference line, the workpiece conveying mechanism C laminates the first workpiece W1 on the second workpiece W2 such that the light receiving surface of the second workpiece W2 gradually contacts the light receiving surface of the first workpiece W1. This way of lamination can remove the air from the laminated interface of the two workpieces.

The Steps (22)-(23) convey the first workpiece W1, which is turned over by the workpiece conveying mechanism C, onto the second workpiece W2, perform the positioning of the first workpiece W1 relative to the second workpiece W2, and laminate the two workpieces such that the light receiving surface of the first workpiece W1 contacts the light receiving surface of the second workpiece W2.

G. Conveying and Installing: Operation 7 (Conveying and Installing of the Workpieces)

(24) As illustrated in FIG. 4, the workpiece conveying mechanism C catches the two laminated workpieces (first and second workpieces W1 and W2) placed on the suction stage 41 to remove the two workpieces from the suction stage 41, and conveys the two workpieces to the heating stage 61 of the workpiece heating mechanism D. It should be noted that the conveyance of the two laminated workpieces from the suction stage 41 to the heating stage 61 may be performed by an operator.

(25) The workpiece conveying mechanism C places the two laminated workpieces on the heating stage 61.

The Steps (24)-(25) perform the conveyance of the laminated workpieces from the second workpiece stage 21*b* to the heating stage 61 and the installation of the laminated workpieces on the heating stage 61.

H. Step III: Operation 8 (Heating of the Workpieces)

(26) The temperature control unit 63 starts the temperature control to the heating stage 61. As described above, the heating stage 61 is pre-heated, and therefore the temperature control to the first and second workpieces W1 and W2 is initiated as the first and second workpieces W1 and W2 are installed on the heating stage 61.

The temperature control unit 63 controls the heating unit 62, upon installation of the laminated workpieces W1 and W2 on the heating stage 61, such that the workpiece temperature reaches a predetermined temperature (heating temperature that can avoid the breakage of the laminated workpieces W1 and W2 due to the stress when the workpiece temperature drops to the room temperature after the heating), is maintained at this temperature for a predetermined time (from the start of the workpiece heating until the joining process finishes), and drops. The control to the heating unit 62 is carried out based on the table of the correlation data between the surface temperature of the heating stage 61, the temperature characteristics of the workpieces W1 and W2, and the actual temperature of the workpieces. The table is stored in the temperature control unit 63.

The decrease of the workpiece temperature is caused by the termination of the energy supply to the heating unit 62 (e.g., termination of the electricity supply to the sheath heater embedded in the stage).

As the energy supply to the heating unit 62 terminates, the workpieces W1 and W2 on the heating stage 61 are cooled to the room temperature.

It should be noted that if the cooling time should be reduced, a cooling mechanism (not shown) may be provided in the heating stage 61. The cooling mechanism may include, for example, a cooling tube buried in the heating stage 61, and a coolant may flow in the cooling tube. Heat exchange between the coolant and the heating stage 61 cools the heating stage 61. The control to the cooling mechanism may be performed by the temperature control unit 63. For example, the temperature control unit 63 stops the electricity supply to the sheath heater, activates the cooling mechanism, and controls the cooling mechanism, based on the information of the surface temperature of the heating stage 61 measured by the temperature sensor (not shown), such that the surface temperature of the heating stage 61 becomes the room temperature.

Modified Example 1 of the Bonding Device

The operations of the respective components of the above-described bonding device are controlled by the associated control units.

Specifically, the lamp lighting device 12 controls the lighting and extinguishing of the lamps 11*a* as well as the lighting time of the lamps 11*a*. The stage moving mechanism drive and control unit 24*a* controls the movements (operations) of the stage moving mechanism 24 configured to move the movable stage 23, the first workpiece stage 21*a* and the second workpiece stage 21*b* in the up and down directions.

The conveying mechanism drive and control unit 31*a* controls the movements of the workpiece conveying mechanism drive unit 31 that drives the workpiece conveying unit 30. The workpiece conveying unit 30 has a function of clamping and holding the first and second workpieces W1 and W2, a function of conveying and placing the first and second workpieces W1 and W2, which are stored in the workpiece storage mechanism (not shown), on the first and second workpiece stages 21*b* and 21*b* respectively, a function of conveying and placing the first workpiece W1 on the first workpiece stage 21*a* and the second workpiece W2 on the second workpiece stage 21*b* on the suction stage 41, a function of turning over the first workpiece W1 such that the irradiated surface (surfaced cleaned by the megasonic cleaning mechanism) of the first workpiece W1 faces the plane including the irradiated surface (surface cleaned by the megasonic cleaning mechanism) of the second workpiece W2, and a function of conveying the turned-over first workpiece W1 on the second workpiece W2.

The conveying mechanism drive and control unit 31*a* also controls movements of the workpiece conveying mechanism drive unit 31 that drives the workpiece conveying unit 30, which has a function of laminating the first workpiece W1 on the second workpiece W2 such that the irradiated surface of the first workpiece W1 contacts the irradiated surface of the second workpiece W2, an alignment function of positioning (aligning) the first workpiece W1 relative to the second workpiece W2 in the crystal axis direction prior to laminating the first workpiece W1 on the second workpiece W2, and a function of conveying the laminated workpieces placed on the suction stage 41 to the heating stage 61.

The stage moving mechanism drive and control unit 24*a* controls the movements of the stage moving mechanism 24 that moves the movable stage 23 and the first and second workpiece stages 21*a* and 21*b* placed on the movable stage 23 upwards and downwards.

The vacuum chuck drive and control unit 46 controls the movements of the vacuum supply mechanism 45 that operates the vacuum chuck mechanism.

The cleaning mechanism drive and control unit 54*a* controls the movements of the cleaning mechanism drive unit 54 that has a function of supplying the pure water to the water stream nozzles 52*a* and 52*b* from the pure water supply unit (not shown), a function of supplying the clean gas to the gas nozzles 53*a* and 53*b* from the clean gas supply unit (not shown), a function of driving the supersonic vibrators 51*a* and 51*b*, and a function of controlling the positions of the water stream nozzles 52*a* and 52*b* and the gas nozzles 53*a* and 53*b*.

The temperature control unit 63 controls the heating unit 62, based on the information of the surface temperature of the heating stage 61, which is measured by the temperature sensor (not shown), such that the surface temperature of the heating stage 61 becomes the predetermined temperature. If necessary, the temperature control unit 63 controls the cooling mechanism (not shown) based on the above-mentioned temperature information such that the surface temperature of the heating stage 61 becomes the predetermined temperature.

These control units perform the respective control in each of the STEP I to the STEP III.

Figure 11:
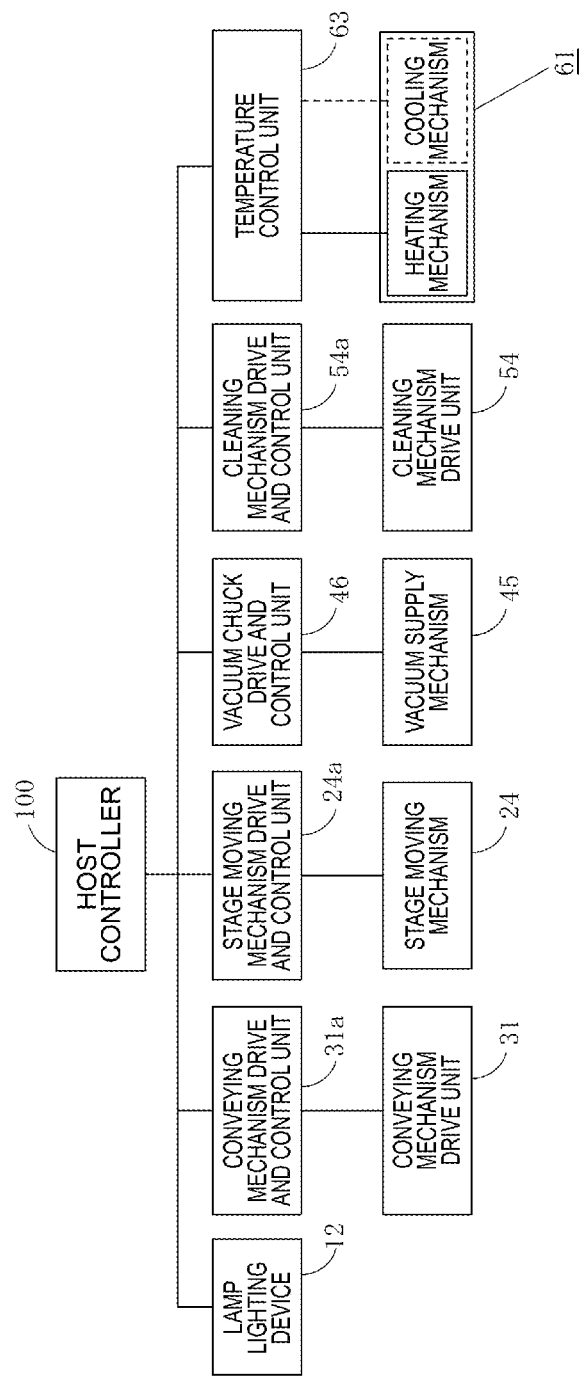
FIG. 11 illustrates an exemplary arrangement of control units when a host controller is provided.

As depicted in FIG. 11, a host controller 100 may be provided which is a controller to instruct the implementing timing to the respective control units such that a series of steps are carried out automatically.

The host controller stores, in advance, the instructions which are relevant to the STEPs I to III, and controls the respective control units based on the instructions.

Modified Example 2 of the Bonding Device

As mentioned earlier, if the inorganic substance-based impurities do not (or almost do not) exist on the workpieces prior to the bonding process, the function of removing the inorganic substance-based impurities is unnecessary. In such case, the workpiece cleaning and laminating mechanism B does not need the workpiece cleaning function, and therefore the light irradiating mechanism A may perform the workpiece lamination.

The Steps (8)-(19) become unnecessary in the Steps (1)-(26). The lamination of the first and second workpieces W1 and W2 on the suction stage 41, which is carried out in the Steps (20)-(23), may be carried out on the second workpiece stage 21b of the light irradiating mechanism A.

In other words, after the Step (5) is finished and the vacuum ultraviolet light irradiation in the STEP I is finished, then the following steps are performed.

(A) As shown in FIG. 6, the stage moving mechanism drive and control unit 24a drives the stage moving mechanism 24 to move the movable stage 23 downward and adjust the height of the first and second workpiece stages 21a and 21b to a predetermined height. The predetermined height is the height that can avoid the collision of the first workpiece W1 and the workpiece conveying mechanism C on the first workpiece stage 21a when the first workpiece W1 caught by the workpiece conveying mechanism C is turned over above the first workpiece stage 21a by the workpiece conveying mechanism C.

(B) The conveying unit 30 of the workpiece conveying mechanism C enters the space between the first and second workpiece stages 21a and 21b and the light irradiating unit 10, which is situated above the first and second workpiece stages, and catches the first workpiece W1.

(C) The conveying unit 30 of the workpiece conveying mechanism C which catches the first workpiece W1 moves the first workpiece W1 upwards by a predetermined distance, and then turns over the first workpiece W1 such that the irradiated surface of the first workpiece W1 faces the first workpiece stage 21a. The predetermined distance is a height that can avoid the collision of the first workpiece W1 and the conveying unit 30 on the first workpiece stage 21a and the light irradiating unit 10.

The Steps (B)-(C) cause the workpiece turning over mechanism to catch the first workpiece W1 and turn over the first workpiece W1 such that the irradiated surface of the first workpiece W1 faces the first workpiece stage 21a.

The workpiece conveying mechanism C is driven by the conveying mechanism drive unit 31 under the control of the conveying mechanism drive and control unit 31a.

(D) The first workpiece W1, which is turned over by the conveying unit 30 of the workpiece conveying mechanism C, is conveyed over the second workpiece W2 by the conveying unit 30.

(E) Subsequently, the workpiece conveying mechanism C positions the first workpiece stage 21a (in the crystal axis direction) with the positioning pins 22, which are used to position the second workpiece W2 on the second workpiece stage 21b, and laminates the first workpiece W1 on the second workpiece W2. Specifically, the conveying unit 30 of the workpiece conveying mechanism C pushes the first workpiece W1 against the positioning pins 22 provided on the second workpiece stage 21b to position the first workpiece W1. The height of the positioning pins 22 provided on the second workpiece stage 21b is greater than the thickness of the second workpiece W2 placed on the second workpiece stage 21b.

After the Step (E), the Step (24) and the subsequent Steps described in the above-described embodiment are performed. Although the conveying unit 30 of the workpiece conveying mechanism C catches the two laminated workpieces (first and second workpieces W1 and W2) placed on the suction stage 41, removes the two workpieces from the suction stage 41, and conveys the two workpieces to the heating stage 61 of the workpiece heating mechanism D in the Step (24), the conveying unit 30 catches the two laminated workpieces (first and second workpieces W1 and W2) placed on the second workpiece stage 21b, removes the two workpieces from the second workpiece stage 21b, and conveys the two workpieces to the heating stage 61 of the workpiece heating mechanism D in the Modified Example 2 of the Bonding Device.

Because the bonding device of the above-described embodiment has the light irradiating mechanism A, the workpiece cleaning and laminating mechanism B, the workpiece conveying mechanism C, and the workpiece heating mechanism D, the bonding device can perform the STEP I, the STEP II and the STEP III of the exemplary bonding method of the present invention. Furthermore, the workpiece cleaning and laminating mechanism B may perform the step of removing the inorganic substance-based impurities from the workpiece between the STEP I and the STEP II.

In particular, because the bonding device according to the embodiment of the present invention has the above-mentioned four separate mechanisms, it is possible to preliminarily heat the heating stage 61 of the workpiece heating mechanism D in advance, and also possible to quickly heat the workpieces, which are conveyed to the heating stage 61, after the workpiece lamination of the STEP II.

The light irradiating mechanism A can arbitrarily set the distance between the irradiated surfaces of the first and second workpieces W1 and W2 and the light irradiating unit 10 with the height adjustment collars 26b, which serve as the distance setting mechanism.

For example, if the UV light directed onto the irradiated surfaces of the two workpieces from the light irradiating unit 10 has a center wavelength at 172 nm, it is possible to set the distance between the lower portions of the lamps 11a and the irradiated surfaces of the two workpieces to, for example, 1-5 mm. Thus, even when the first and second workpieces W1 and W2 are irradiated in the atmosphere with the UV light having the wavelength of 172 nm, which significantly attenuates in the atmosphere, it is possible to reform the surfaces of the first and second workpieces W1 and W2. In other words, it is not necessary to use a vacuum atmosphere, in which the UV light having the wavelength of 172 nm does not attenuate, as the UV light irradiation atmosphere, and therefore the entire device can be made more compact.

II. Bonding Experiments

In the following description, the present invention will be further described in detail using examples of the bonding method. It should be noted, however, that the present invention is not limited to these examples.

Two quartz substrates were used as a pair of workpieces, and such pair of workpieces were joined to each other by the bonding method according to the embodiment of the present invention.

The workpieces had the following shape.

The shape of each of the two quartz substrates to be joined had a thickness of 0.5 mm, a length of 50.8 mm and a width of 50.8 mm. Both surfaces of each quartz substrate were optically polished. The above-described bonding device was used to join the two quartz substrates to each other.

Experiment conditions were as follows.

Step I

The quarts substrates were irradiated with light emitted from an excimer lamp that had a center wavelength at 172 nm. The irradiance at the workpiece surface was 5 mW/cm$^2$, and the irradiating time was 90 seconds.

Subsequently, a pair of workpieces underwent the megasonic cleaning. The cleaning liquid used in the megasonic cleaning was pure water, and the vibration frequency imparted to the pure water stream was 1 MHz. The clean gas was air.

Step II

The irradiated joining surface of one workpiece faced the irradiated joining surface of the other workpiece, and the workpieces were laminated such that the joining surface of one workpiece contacted the joining surface of the other workpiece. The positioning (alignment) of the two workpieces was performed with the positioning pins 42 provided on the suction stage 41.

Step III

In order to heat the laminated workpieces, the workpieces were put in the heating furnace, which was heated beforehand, headed for a predetermined time, and taken out of the heating furnace.

The laminating direction of the two quartz substrates (the crystal orientations of the two quartz substrates were orthogonal to each other or parallel to each other when the two quarts substrates were laminated), the heating temperature, and the heating time were the parameters, and the STEP II and the STEP III were performed under the following four conditions. The conditions and the good/no good of the joining quality are shown in the table below. The joining quality was "Y" when the laminated and heated two quartz substrates were pulled in the exfoliating directions by the force of 500 N per unit area (500 N/cm$^2$), and one substrate did not exfoliate from the other substrate. The joining quality was "N" when the laminated and heated two quartz substrates were pulled in the exfoliating directions by the force of 500 N per unit area (500 N/cm$^2$), and one substrate exfoliated from the other substrate, or the joining of the two substrates itself failed.

After the STEP III, some workpieces cracked when the temperature of the joined workpieces became the room temperature. The joining quality of such case was "N".

The results of the experiments are shown in Table 1.

TABLE 1

| Condition # | Laminating Direction | Heating Temperature (degree C.) | Heating Time (hour) | Joining Quality |
|---|---|---|---|---|
| 1 | Vertical | Room temperature | 4 | N (no good) |
| 2 | Vertical | 100 | 4 | N |
| 3 | Vertical | 180 | 4 | N |
| 4 | Vertical | 200 | 4 | Y (good) |
| 5 | Vertical | 250 | 4 | Y |
| 6 | Vertical | 300 | 2 | N (cracking) |
| 7 | Parallel | Room temperature | 4 | N |
| 8 | Parallel | 200 | 4 | Y |
| 9 | Parallel | 300 | 2 | Y |

As understood from Table 1, when a pair of quartz substrates were laminated such that the crystal orientation of one quartz substrate crossed the crystal orientation of the other quartz substrate at right angles, and the joining quality was examined at various heating temperatures, then it was found that the joining was not completed at the temperature equal to or lower than 200 degrees C. even when the heating was performed four hours but the joining was completed at the temperature equal to or greater than 200 degrees C. When a pair of quartz substrates were laminated such that the crystal orientation of one quartz substrate was parallel to the crystal orientation of the other quartz substrate, the joining was also completed at the heating temperature equal to or greater than 200 degrees C.

Accordingly, it was found that when a pair of quartz substrates should be bonded to each other, the joining was possible as long as the joining process was carried out at the heating temperature equal to or greater than 200 degrees C., regardless of whether the crystal orientations of the two laminated quartz substrate crossed orthogonally or extended in parallel to each other.

Although the heating temperature and the heating time are the same in the Condition 6 and Condition 9, the laminated quartz substrates cracked under the Condition 6 while no cracking occurred under the Condition 9. Under the Condition 6, the two quartz substrates were laminated such that the crystal orientations of the two crystal substrates were orthogonal to each other, and therefore the directions of the thermal expansion of the two quartz substrates were different from each other.

Under the Condition 9, on the other hand, the two quartz substrates were laminated such that the crystal orientations of the two quartz substrates were parallel to each other, and therefore the directions of the thermal expansion of the two quartz substrates were generally of substantially the same. Accordingly it was assumed that the stress generated when the heated two quartz substrates returned to the room temperature was greater in the two quartz substrates joined under the Condition 6 than in the two quartz substrates joined under the Condition 9, and consequently the cracking occurred in the two quartz substrates joined under the Condition 6.

However, no cracking occurred in the two quartz substrates under the Conditions 4 and 5, under which the two quartz substrates were laminated such that the crystal orientations of the two quartz substrates were orthogonal to each other. In other words, even when the two quartz substrates were laminated such that the crystal orientations of the two quartz substrates were orthogonal to each other, no cracking occur in the two quartz substrate and the joining of the two quartz substrates was achieved if the heating temperature was adjusted. Intensive experiments revealed that when the two quartz substrates were laminated such that the crystal orientations of the two quartz substrates were orthogonal to each other, and the workpiece heating temperature was not over 300 degrees C., the workpieces did not crack.

No cracking occurred in the two quartz substrates under the Conditions 8 and 9, under which the two quartz substrates were laminated such that the crystal orientations of the two quartz substrates were parallel to each other. It was understood that the heating temperature under these conditions was the temperature that did not cause the laminated workpieces to break due to the stress upon returning to the room temperature after the heating. It was confirmed that when the temperature was set to a higher value under such heating conditions, the high tensile strength could be obtained even if the heating time was reduced.

In the above-described experiments, some pairs of workpieces were joined to each other without performing the megasonic cleaning, and the obtained results for these pairs of workpieces were similar to those as described above. However, when the pulling force (tensile force) was applied to those two workpieces (quartz substrates), which had the good joining quality, in the direction of exfoliating the joined two workpieces while the pulling force was gradually increased from 500 N/cm$^2$, the pulling force to exfoliate the two workpieces from each other was smaller for the workpieces which were joined without the megasonic cleaning than for the workpieces which were joined with the megasonic cleaning. It was assumed that this was because inorganic substance-based impurities adhered on some portions of the quartz substrate surfaces before the lamination, when the quartz substrates were joined to each other without the megasonic cleaning.

A glass substrate and the quartz substrate were joined to each other and the two glass substrates were joined to each other under the same conditions as the above-described experiments. It was confirmed that the joining of the two substrates succeeded (had good quality) in both cases if the heating temperature was set to a temperature that could avoid the breakage of the laminated substrates (workpieces) due to the stress when the substrate temperature returned to the room temperature after the heating.

Although the workpieces were irradiated with the light emitted from the excimer lamp which had the center wavelength at 172 nm in the above-described experiments, the ultraviolet light emitting source is not limited to such excimer lamp. For example, a low pressure mercury lamp or a noble gas fluorescent lamp may be used. Researches carried out by the inventors found that the bonding according to the embodiments of the present invention was possible when the workpieces were irradiated with the ultraviolet light at the wavelength equal to or less than 250 nm.

REFERENCE SIGNS LIST

10: Light irradiating unit
10a: Lamp housing
11a: Lamp
11b: Reflection mirror
12: Lamp lighting device
21a: First Workpiece stage
21b: Second Workpiece stage
22: Positioning pins
23: Movable stage
24: Stage moving mechanism
24a: Stage moving mechanism drive and control unit
25: Drive shaft
26: Posts
26a: Flange portion
26b: Height adjustment collar
27: Base
30: Conveying unit
31: Conveying mechanism drive unit
31a: Conveying mechanism drive and control unit
41: Suction stage
41a: Suction groove
41b: Vacuum supply path
41c: Vacuum supply hole
42: Positioning pins
43: Vacuum supply tube
44: Water discharge drain
45: Vacuum supply mechanism
46: Vacuum chuck drive and control unit
47: Sink
50a, 50b: Megasonic cleaning mechanisms
51a, 51b: Supersonic vibrators
52a, 52b: Water stream nozzles
53a, 53b: Gas nozzles
54: Cleaning mechanism drive unit
54a: Cleaning mechanism drive and control unit
61: Heating stage
62: Heating unit
63: Temperature control unit
100: Host controller
A: Light irradiating mechanism
B: Workpiece cleaning and laminating mechanism
C: Workpiece conveying mechanism
D: Workpiece heating mechanism
W1: First workpiece
W2: Second workpiece

The invention claimed is:

1. A workpiece bonding method for bonding an optically polished surface of a first workpiece and an optically polished surface of a second workpiece to each other, the first and second workpieces being a glass substrate and another glass substrate, a glass substrate and a quartz substrate, or a quartz substrate and another quartz substrate, at least one of two surfaces of the first workpiece being optically polished, and at least one of two surfaces of the second workpieces being optically polished, said workpiece bonding method comprising:
   preparing the first workpiece that has no inorganic impurities on the optically polished surface thereof;
   preparing the second workpiece that has no inorganic impurities on the optically polished surface thereof;
   irradiating the optically polished surface of the first workpiece and the optically polished surface of the second workpiece with vacuum ultraviolet light;
   placing and fixing the first workpiece and the second workpiece, after said irradiating, onto a cleaning stage such that the optically polished surfaces of the first workpiece and the second workpiece each face away from the cleaning stage;
   while the second workpiece remains fixed on the cleaning stage, moving the first workpiece over the second workpiece and turning over the first workpiece such that the optically polished surface of the first workpiece faces the optically polished surface of the second workpiece;
   laminating the first workpiece on the second workpiece such that the optically polished surface of the first workpiece and the optically polished surface of the second workpiece contact each other;
   placing the laminated first and second workpieces on a heating stage such that a lower surface of the second workpiece contacts an upper surface of the heating stage;
   heating the heating stage, with the second workpiece being placed on the heating stage and the first workpiece being laminated on the second workpiece such that the second workpiece is directly heated by the heated heating stage;
   using the heated heating stage as a sole heating unit for heating the first and second workpieces;
   measuring a temperature of the upper surface of the heating stage;
   controlling the temperature of the upper surface of the heating stage, based on the measured temperature of the upper surface of the heating stage, such that the temperatures of the first and second workpieces rise to a temperature equal to or greater than 200 degrees C.; and
   maintaining the temperature of the upper surface of the heating stage until the first and second workpieces are bonded to each other.

2. The workpiece bonding method according to claim 1, wherein the first and second workpieces are said quartz substrate and said another quartz substrate, the first and second workpieces are laminated such that crystal axis directions of the first and second workpieces cross each other, and said heating after said laminating is carried out at a temperature equal to or lower than 300 degrees C.

3. The workpiece bonding method according to claim 2, further comprising heating the heating stage prior to said placing the laminated first and second workpieces on the heating stage.

4. The workpiece bonding method according to claim 2, wherein said laminating includes bringing one end of the first workpiece into contact with one end of the second workpiece, and then bringing the entire optically polished surface of the first workpiece into contact with the entire optically polished surface of the second workpiece.

5. The workpiece bonding method according to claim 2, wherein said laminating includes bending the first workpiece such that the optically polished surface of the first workpiece has a convex shape, bringing a peak of the optically polished surface of the bent first workpiece into contact with the optically polished surface of the second workpiece, and releasing the bending to bring the entire optically polished surface of the first workpiece into contact with the optically polished surface of the second workpiece.

6. The workpiece bonding method according to claim 2, further comprising cleaning, while the first and second workpieces are fixed on the cleaning stage, the optically polished surfaces of the first and second workpieces with megasonic, after irradiating the optically polished surfaces of the first and second workpieces with the vacuum ultraviolet light and before laminating the first and second workpieces such that the optically polished surfaces of the first and second workpieces contact each other.

7. The workpiece bonding method according to claim 1, further comprising heating the heating stage prior to said placing the laminated first and second workpieces on the heating stage.

8. The workpiece bonding method according to claim 7, wherein said laminating includes bringing one end of the first workpiece into contact with one end the second workpiece, and then bringing the entire optically polished surface of the first workpiece into contact with the entire optically polished surface of the second workpiece.

9. The workpiece bonding method according to claim 7, wherein said laminating includes bending the first workpiece such that the optically polished surface of the first workpiece has a convex shape, bringing a peak of the optically polished surface of the bent first workpiece into contact with the optically polished surface of the second workpiece, and releasing the bending to bring the entire optically polished surface of the first workpiece into contact with the optically polished surface of the second workpiece.

10. The workpiece bonding method according to claim 7, further comprising cleaning, while the first and second workpieces are fixed on the cleaning stage, the optically polished surfaces of the first and second workpieces with megasonic, after irradiating the optically polished surfaces of the first and second workpieces with the vacuum ultraviolet light and before laminating the first and second workpieces such that the optically polished surfaces of the first and second workpieces contact each other.

11. The workpiece bonding method according to claim 1, wherein said laminating includes bringing one end of the first workpiece into contact with the one end of the second workpiece, and then bringing the entire optically polished surface of the first workpiece into contact with the entire optically polished surface of the second workpiece.

12. The workpiece bonding method according to claim 1, wherein said laminating includes bending the first workpiece such that the optically polished surface of the first workpiece has a convex shape, bringing a peak of the optically polished surface of the bent first workpiece into contact with the optically polished surface of the second workpiece, and releasing the bending to bring the entire optically polished surface of the first workpiece into contact with the optically polished surface of the second workpiece.

13. The workpiece bonding method according to claim 1, further comprising cleaning, while the first and second workpieces are fixed on the cleaning stage, the optically polished surfaces of the first and second workpieces with megasonic, after irradiating the optically polished surfaces of the first and second workpieces with the vacuum ultraviolet light and before laminating the first and second workpieces such that the optically polished surfaces of the first and second workpieces contact each other.

14. The workpiece bonding method according to claim 1, wherein said irradiating the optically polished surface of the first workpiece and the optically polished surface of the second workpiece with the vacuum ultraviolet light is carried out, with a distance between the optically polished surface of the first workpiece and a light source of the vacuum ultraviolet light being in a range from 1 mm to 5 mm, and a distance between the optically polished surface of the second workpiece and the light source of the vacuum ultraviolet light being in a range from 1 mm to 5 mm.

15. The workpiece bonding method according to claim 1, further comprising:
produce an active oxygen on the optically polished surfaces of the first and second workpieces; and
removing organic impurities, which are present on the optically polished surfaces of the first and second workpieces, by a reaction between the active oxygen and the organic impurities.

16. A method of joining a first workpiece to a second work piece, the first and second workpieces being a glass substrate and another glass substrate, a glass substrate and a quartz substrate, or a quartz substrate and another quartz substrate, said method comprising:
preparing the first workpiece that has an optically polished surface;
preparing the second workpiece that has an optically polished surface;
irradiating the optically polished surface of the first workpiece and the optically polished surface of the second workpiece with vacuum ultraviolet light;
placing and fixing the first workpiece and the second workpiece, after said irradiating, onto a cleaning stage such that the optically polished surface of the first workpiece and the optically polished surface of the second workpiece face away from the cleaning stage;
while the second workpiece remains fixed on the cleaning stage, moving the first workpiece over the second workpiece and turning over the first workpiece such that the optically polished surface of the first workpiece faces the optically polished surface of the second workpiece;
stacking the first workpiece on the second workpiece such that the optically polished surface of the first workpiece and the optically polished surface of the second workpiece contact each other;
placing the stacked first and second workpieces on a heating stage such that a lower surface of the second workpiece contacts an upper surface of the heating stage;
heating the heating stage, with the second workpiece being placed on the heating stage and the first workpiece being stacked on the second workpiece such that the second workpiece is directly heated by the heated heating stage;

using the heated heating stage as a sole heating unit for heating the first and second workpieces;

measuring a temperature of the upper surface of the heating stage;

controlling the temperature of the upper surface of the heating stage, based on the measured temperature of the upper surface of the heating stage, such that the temperatures of the first and second workpieces rise to a temperature equal to or greater than 200 degrees C.; and maintaining the temperature of the upper surface of the heating stage until the first and second workpieces are bonded to each other.

* * * * *